US007174495B2

(12) United States Patent
Boutillon et al.

(10) Patent No.: US 7,174,495 B2
(45) Date of Patent: Feb. 6, 2007

(54) LDPC DECODER, CORRESPONDING METHOD, SYSTEM AND COMPUTER PROGRAM

(76) Inventors: Emmanuel Boutillon, 2 rue de Prague, 56100 Lorient (FR); Jacky Tousch, 17 rue Kerandiou, 29217 Le Conquet (FR); Frederic Guilloud, 59 rue Barrault, 75013 Parris (FR)

( * ) Notice: Subject to any disclaimer, the term of this patent is extended or adjusted under 35 U.S.C. 154(b) by 479 days.

(21) Appl. No.: 10/742,643

(22) Filed: Dec. 19, 2003

(65) Prior Publication Data

US 2005/0138519 A1     Jun. 23, 2005

(51) Int. Cl.
*H03M 13/00* (2006.01)
*G06F 11/00* (2006.01)

(52) U.S. Cl. .................... 714/752; 714/801

(58) Field of Classification Search .......... 714/752, 714/759, 794–795, 801; 375/262, 341
See application file for complete search history.

(56) References Cited

U.S. PATENT DOCUMENTS

2005/0204271 A1* 9/2005 Sharon et al. ............. 714/801

OTHER PUBLICATIONS

J. Zhang and M. Fossorier, "Shuffled Belief Propagation Decoding", IEEE 2002, pp. 8-15.
Pearl, J., "Probabilistic Reasoning in Intelligent Systems: Networks of Plausible Inference", San Mateo,CA: Morgan Kaufmann Publishers, Inc., 1988, pp. 1-7.
Kschischang, F.R. and Frey, B.J., "Iterative Decoding of Compound Codes by Probability Propagation in Graphical Models", IEEE Journal on Selected Areas in Communications, Feb. 1998, vol. 16, pp. 219-230.
Kschischang, F.R., and Frey, B.J. and Loeliger, H., "Factor Graphs and the Sum-Product Algorithm", IEEE Trans. on Information Theory, Feb. 2001, vol. 47, No. 2, pp. 498-519.
Gallager, R.G., "Low-Density Parity-Check Codes", 1963 SCHOOL=MIT, pp. 2-13.
Boutillon, E. and Castura, J. and Kschischang, F.R., "Decoder-First Code Design", Proceedings of the 2nd International Symposium on Turbo Codes and Related Topics, Brest, France, 2000 pp. 459-462.
MacKay, D.J.C., "Good Error-Correcting Codes Based on Very Sparse Matrices", IEEE Transactions on Information Theory, Mar. 1999, vol. 45, No. 2, pp. 399-431.
Blanksby, A.J. and Howland C.J., "A 690-mW I-Gb/s 1024-b, Rate-1/2 Low-Density Parity-Check Code Decoder", IEEE Journal of Solid-State Circuits, Mar. 2002 vol. 37, No. 3, pp. 404-412.

(Continued)

*Primary Examiner*—Guy J. Lamarre
(74) *Attorney, Agent, or Firm*—Westman, Champlin & Kelly

(57) ABSTRACT

A decoder of LDPC codewords using the iterative belief propagation algorithm stores a posteriori information on variables. An updating device updates the a posteriori information on variables, and a first computation device computes variables to constrain messages from a posteriori information on variables and variable to constraint messages from previous iteration. A second computation device computes a constraint to variable messages from variable to constraint messages computed by the first computation device. A further computation device updates the a posteriori information on variables. A shuffle device transfers the a posteriori information on variables to the first computation device, and a further shuffle device transfers information from the second computation device to the storing device. The decoder further includes a device for compression-storage-decompression of the constraint to variable messages. The disclosure also relates to a corresponding method, computer program and system.

14 Claims, 18 Drawing Sheets

OTHER PUBLICATIONS

Zhang, T. and Parhi, K.K., "Joint Code and Decoder Design for Implementation -Oriented (3, k)-regular LDPC codes", IEEE Conference Record of the Thirty-Fifth Asilomar Conference on Signals, Systems and Computers, 2001, vol. 2 pp. 1232-1236.

Zhang, T. and Wang, Z and Parhi, K.K., "On Finite Precision Implementation of Low Density Parity Check Codes Decoder", Proceedings of ISCAS, Sydney, Australia, May 2001. pp. 1-4.

Zhang, T. and Parhi, K.K., "VLSI Implementation-Oriented (3,k)-Regular Low-Density Parity-Check Codes", IEEE Workshop on Signal Processing Systems 2001, SIPS, Sep. 2001, pp. 25-36.

Luby, M.G. and Mitzemnacher, M. and Shokrollahi, M.A. and Spielman, D.A., "Improved Low-Density Parity-Check Codes Using Irregular Graphs", IEEE Transactions on Information Theory, Feb. 2001 vol. 47, No. 2, pp. 585-598.

Richardson, T.J. and Urbanke, R.L, "The Capacity of Low-Density Parity-Check Codes Under Message-Passing Decoding", IEEE Transactions on Information Theory, Feb. 2001, vol. 47, No. 2, pp. 599-618.

Richardson, T.J. and Shokrollahi, M.A. and Urbanke, R.L., "Design of Capacity-Approaching Irregular Low-Density Parity-Check Codes", IEEE Transactions on Information Theory, Feb. 2001 vol. 47, No. 2, pp. 619-637.

Richardson, T.J. and Urbanke, R.L., "Efficient Encoding of Low-Density Parity-Check Codes", IEEE Transactions on Information Theory, Feb. 2001, vol. 47, No. 2, pp. 638-656.

Chung, S-Y. and Forney, G.D. and Richardson, T.J. and Urbanke, R.L, "On the Design of Low-Density Parity-Check Codes within 0.0045 dB of the Shannon Limit", IEEE Communications Letters, 2001 vol. 5, No. 2, pp. 58-60.

Forney, G.D., "On Iterative Decoding and the Two-Way Algorithm", Proc. of the Int. Symp. on Turbo-Codes Topics, Brest, France, 1997.

MacKay, D.J.C and Neal, R.M., "Good Codes Based on Very Sparse Matrices", 5th IMA Conference on Cryprography and Coding, Berlin, Germany, Springer, 1997. pp. 1-12.

Mackay, D.J.C and Neal, R.M., "Near Shannon Limit Performance of Low-Density Parity-Check Codes", IEEE Electronic Letter, vol. 32, No. 18, 1996, pp. 1645-1646.

Chen, J. and Fossorier, M.P.C., "Density Evolution for Two Improved BP-Based Decoding Algorithms of LDPC Codes", IEEE Communication Letters,vol. 6, No. 5, May 2002, pp. 208-210.

Fossorier, M.P.C. and Mihaljevic, M. and Imai, I., "Reduced Complexity Iterative Decoding of Low-Density Parity-Check Codes Based on Belief Propagation", IEEE Transactions on Communications, vol. 47, No. 5, May 1999, pp. 673-680.

MacKay, D.J.C and Wilson, S.T. and Davey, M.C., "Comparison of Constructions of Irregular Gallager Codes", IEEE Transaction on Communications, vol. 47, No. 10, Oct. 1999, pp. 1449-1454.

Eleftheriou, E. and Mittelholzer, T. and Dholakia, A., "Reduced-Complexity Decoding Algorithm for Low-Density Parity-Check Codes", IEEE Electronics Letters, vol. 37, No. 2, Nov. 2000, pp. 102-104.

Lafferty, J. and Rockmore, D., "Codes and Iterative Decoding on Algebraic Expander Graphs", International Symposium on Information Theory and its Applications, Honolulu, Hawai, U.S.A., Nov. 2000, pp. 1-4.

Fossorier, M.P.C., "Iterative Reliability-Based Decoding of Low-Density Parity-Check Codes", IEEE Journal on Selected Areas in Communications,vol. 19, No. 5, May 2001,pp. 908-917.

Leung, W.K. and Lee, W.L. and Wu, A. and Li, P., "Efficient Implementation Technique of LDPC Decoder", IEEE Electronic Letters, vol. 37, No. 20, Nov. 2001, pp. 1231-1232.

Mao Y. and Banihashemi, A.H., "Decoding Low-Density Parity-Check Codes With Probabilistic Scheduling", IEEE Communications Letters,vol. 5, Oct. 2001,pp. 414-416.

Hu, X.-Y. and Eleftheriou, E. and Arnold, D.-M. and Dholakia, A., "Efficient Implementations of the Sum-Product Algorithm for Decoding LDPC Codes", IEEE Global Telecommunications Conference, Nov. 2001, pp. 1036-1036.

Kou, Y. and Lin, S. and Fossorier, M.P.C., "Low-Density Parity-Check Codes Based on Finite Geometries: A Rediscovery and New Results", IEEE Transactions on Information Theory, vol. 47, No. 7, Nov. 2001, pp. 2711-2736.

Campello, J. and Modha, D.S., "Extended Bit-Filling and LDPC Code Design", IEEE Global Telecommunications Conference, Nov. 2001, pp. 985-989.

Chen, J. and Fossorier, M.P.C., "Decoding Low-Density Parity-Check Codes with Normalized APP-Based Algorithm", IEEE Global Telecommunications Conference, Nov. 2001, pp. 1026-1030.

Haley, D. and Grant, A. and Buetefuer, "Iterative Encoding of Low-Density Parity-Check Codes", 3rd AusCTW, Feb. 2002, Camberra, Australia, pp. 1-3.

Chen, J. and Fossorier, M.P.C., "Near Optimum Universal Belief Propagation Based Decoding of Low-Density Parity-Check Codes", IEEE Transactions on Communications,vol. 50, No. 3, Mar. 2002, pp. 406-414.

Ping, L. and Leung, W.K., "Decoding of Low-Density Parity-Check Codes with Finite Quantization", IEEE Communications Letters,vol. 4, No. 2, Feb. 2000,pp. 62-64.

Yeo, E. and Pakzad, P. and Nikolic, B. and Anantharam, V., "VLSI Architectures for Iterative Decoders in Magnetic Recording Channels", IEEE Transactions on Magnetics,vol. 37, No. 2, Mar. 2001, pp. 748-755.

Kim, S. and Sobelman, G.E. and Moon, J., "Parallel VLSI Architectures for a Class of LDPC Codes", IEEE ISCAS 2002, pp. 1193-1196.

Mansour, M.M. and Shanbhag, N.R., "Low-Power VLSI Decoder Architectures for LDPC Codes", Int. Symp. Low Power Electronic Design, Aug. 12-14, 2002, pp. 1 (Abstract).

Levine, B. and Taylor, R.R. and Schmit, H., "Implementation of Near Shannon Limit Error-Correcting Codes Using Reconfigurable Hardware", IEEE Field-Programmable Custom Computing Machines, 2000 IEEE, pp. 217-226.

Hagenauer, J. and Offer, E and Papke, L., "Iterative Decoding of Binary Block and Convolutional Codes", IEEE Transactions on Information Theory, vol. 42, No. 2, Mar. 1996, pp. 429-445.

Battail, G. and EI-Sherbini, A. H. M., "Coding for Radio Channels", Ann. T'elecommun. ,vol. 37, No. 1-2, 1982, pp. 75-96.

Waksman, A., "A Permutation Network", Journal of the Association for Computing Machinery, vol. 15, No. 1, Jan. 1968, pp. 159-163.

Yeo, E. and Nikolic, B. and Anantharam, V., "Architectures and Implementations of Low-Density Parity Check Decoding Algorithms", IEEE International Midwest Symposium on Circuits and Systems, Aug. 4-7, 2002, pp. 1-4.

Yeo, E. and Nikolic, B. and Anantharam, V., "High Throughput Low-Density Parity-Check Decoder Architectures", IEEE Globecom, San Antonio, Nov. 25-29, 2001, pp. 3019-3024.

Mackay, D.J.C., "Encyclopedia of Sparse Graph Codes" LDPC database, Available at htttp://www.inference.phy.cam.ac.uk/mackay/co\-des/data.html, Mar. 17, 2005, pp. 1-7.

Urbanke, R., "LdpcOpt", Available at http://lthcwww.epfl.ch/research/ldpcopt/, 2001.

Guilloud, F. and Boutillon, E. and Danger, J.-L., "Decodage des codes LDPC par l'algorithme λ-Min," colloque GRETS1 sur le traitement du signal et des images, septembre 2003, pp. 1-4.

Guilloud, F. and Boutillon, E. and Danger, J.-L., "λ-Min Decoding Algorithm of Regular and Irregular LDPC Codes", 3rd International Symposium on Turbo Codes & related topics, Sep. 1-5, 2003, pp. 1-4.

Hocevar, D.E., "LDPC Code Construction with Flexible Hardware Implementation", IEEE Int. Conf. on Communication, 2003, pp. 2708-2712.

\* cited by examiner

LDPC DECODER, CORRESPONDING METHOD, SYSTEM AND COMPUTER PROGRAM

FIELD OF THE INVENTION

The present invention relates to communications fields and, especially to decoders, system and method dedicated to decoding of Low Density Parity Check codes (so-called LDPC codes).

BACKGROUND OF THE INVENTION

In a transmission between a source and a receiver, some transmission errors may occur. Error correcting codes can be used to detect and correct some of these errors. Low-Density Parity-Check (LDPC) Codes are a class of error correcting code: they are block codes (or equivalently parity-check codes) and are defined by a parity-check matrix H. They were introduced in 1963 by R. G. Gallager (in Gallager's Thesis, "Low-Density Parity-Check Codes", 1963, MIT) in the case of LDPC codes over the Galois Field GF(2) and generalized by Mackay in 1998 (in D. J. C Mackay, M. C. Davey, "Low Density Check Code over GF(q)", Cavendis Laboratory, Cambridge, United Kingdom, 1998) over a Galois Field of higher cardinality, i.e. $GF(r^q)$ where r is a prime number.

LDPC codes can be used in a variety of transmission systems, e.g. satellite communications, wireless transmissions, fiber optics, and a variety of storage media e.g. hard disk drive, optical disk, magnetic band.

An LDPC code is defined by a parity-check matrix H of size M rows by N columns, M being the number of constraints and N being the number of variables. A non-zero entry of the matrix at position (m,n) indicates that the variable $v_n$ participates in the constraint $c_m$.

An LDPC parity check matrix is sparse: there is a small number of non-zero entries in the matrix compared to its size. Let $N(m)=\{v_n:H_{mn}\neq 0\}$ denotes the set of variables $v_n$ that participate in the constraint $c_m$ and N(m)/n denotes the same set with variable $v_n$ excluded. Similarly, $M(n)=\{c_m: H_{mn}\neq 0\}$ denotes the set of constraints $c_m$ in which the variable $v_n$ participates and M(n)/m denotes the same set with the constraint $c_m$ excluded. The cardinality of a set A is denoted by |A|.

A regular (j,k) LDPC code is such that: |N(m)|=k, m={1, ..., M} and |M(n)|=j, n={1, ..., N}. When the cardinality of these two sets is not independent of m and n respectively, the LDPC code is irregular.

LDPC codes can also be defined using their Tanner graph representation. It is a bipartite graph with variable nodes on one side and constraint nodes on the other side. Each variable node corresponds, in the binary case, to a bit of the codeword, and each constraint node corresponds to a parity-check constraint of the code. Edges in the graph attach variable nodes to constraint nodes indicating that the variable participates to the connected constraint.

FIG. 1 depicts an example of a very small LDPC code over GF(2) and its associated Tanner graph, where N=6 and M=4. The variable nodes 10, 11, 12, 13, 14, 15 are connected to the constraint nodes 16, 17, 18, 19 through some edges. The variable to constraint messages $Z_{mn}^{(i)}$ and the constraint to variable messages $L_{nm}^{(i)}$ are exchanged along these edges. The LDPC code illustrated in FIG. 1 corresponds to the following parity check matrix H with 6 columns representing variables v0 to v5 and 4 rows representing constraints c0 to c3:

$$H = \begin{pmatrix} 1 & 1 & 1 & 0 & 0 & 0 \\ 1 & 0 & 0 & 1 & 1 & 0 \\ 0 & 1 & 1 & 0 & 0 & 1 \\ 0 & 0 & 0 & 1 & 1 & 1 \end{pmatrix}.$$

The graph shows 6 variables v0 to v5 (10 to 15) connected to constraints c0 to c3 (16 to 19) according to matrix H.

Thus, for example, variables v0, v1 and v2 are connected to the first constraint c0 according to the first row of H.

|N(m)| is called the weight or degree of the constraint $c_m$.
|M(n)| is called the weight or degree of the variable $v_n$.

STATE OF THE ART

With the introduction of turbo-codes in Berrou, C. and Glavieux, A. and Thitimajshima, P. "Near Shannon limit error-correcting coding and decoding: Turbo-codes" (Proceedings of the International Conference on Communication, ICC 93) in 1993, the concept of iterative decoding of two or more constituent codes has emerged successfully. An LDPC code can be decoded very efficiently using iterative decoding, passing messages along the edges of the Tanner graph of the code, between the nodes. Each node may be viewed as a local processor which process the incoming messages coming from the connected nodes and sends the results as outgoing messages to the connected nodes.

Each iteration comprises two major computation steps:

the constraint node processing, performed for each constraint node.

the variable node processing, performed for each variable node.

These two steps are referred to as horizontal step (constraints) and vertical step (variables).

Hereafter is the "classical" iterative belief propagation decoding algorithm of a binary LDPC (in Mackay, D. J. C. "Good Error-Correcting Codes Based on Very Sparse Matrices" IEEE Transactions on Information Theory, march 1999) code with a scheduling named the flooding scheduling.

All the algorithms described here make use of the Logarithm of Likelihood Ratios (LLR) of the messages, instead of native probabilities. The LLR of a variable $v_n$ is defined as:

$$LLR(v_n,.)=\log(Pr(v_n=1,.)/Pr(v_n=0,.)) \qquad (1)$$

The following notations will be used:

$F_n$ is the LLR of the received value for the variable $v_n$. It is expressed as a function of the set of data observed at the transmission channel output. In many cases $F_n$ is derived from a single received sample, and depends on the modulation used and other channel parameters (e.g. the noise variance for an additive white gaussian channel).

$Z_{mn}$ is the LLR of the variable $v_n$ relative to the message going from variable $v_n$ to the constraint $c_m$. It is called constraint to variable message.

$L_{mn}$ is the LLR of the variable $v_n$ relative to the message going from constraint $c_m$ to the variable $v_n$. It is called the variable to constraint message.

$Z_m$ is the a posteriori information on variable $v_n$.

A superscript (i) is applied to a value X to denote the i-th iteration version of X: $X^{(i)}$.

$i_{max}$ is the maximum number of iterations.

In the case of LDPC codes over $GF(r^q)$, $F_n$ is a vector depending on the $r^q$ a priori probabilities $$P(v_n = \alpha)_{\alpha \in GF(r_q)}.$$

Initialization:
All the variable to constraint messages are initialized:

$$Z_{mn}^{(0)} = F_n$$

Iterations: An iteration i (i=1 to $i_{max}$) comprises three 3 steps:
1/Horizontal step: for each constraint $c_m$ (m=1 to M) do {for each $v_n \in N(m)$ compute:

$$L_{mn}^{(i)} = S_{mn}^{(i-1)} \times M_{mn}^{(i-1)} \quad (2)$$

with $$M_{mn}^{(i)} = -\oplus_{n' \in N(m)/n} (-|Z_{mn'}^{(i)}|) \quad (3)$$

and $$S_{mn}^{(i)} = \text{sign}(Z_{mn}^{(i)}) \times P_m^{(i)} \quad (4)$$

with $P_m^{(i)} = \prod_{n \in N(m)} \text{sign}(Z_{mn}^{(i)})$ $P_m^{(i)}$ takes its value in $\{-1, 1\}$ and represent the parity of the constraint. The quantity $\oplus_n(I_n) = I_0 \oplus I_1 \oplus \ldots I_n$, is the computation over the commutative and associative function $\oplus$ defined by:

$$I_0 \oplus I_1 = \ln\left(\frac{\exp(I_0) + \exp(I_1)}{1 + \exp(I_1 + I_2)}\right) \quad (5)$$

}
2/Vertical steps for each variable$v_n$ (n=1 to N) do {for each $c_m \in M(n)$, compute:

$$Z_{mn}^{(i)} = F_n + \sum_{m' \in M(n)/m} L_{m'n}^{(i)} \quad (6)$$

}
3/Hard-decision and syndrome:
for each variable$v_n$ (n=1 to N) do {

$$Z_n^{(i)} = F_n + \sum_{m \in M(n)} L_{mn}^{(i)} \quad (7)$$

}
Compute the hard decision of all variables:

$$\hat{x}^{(i)} = \{\text{sign}(Z_n^{(i)})\}_{1 \le n \le N}.$$

Calculate the syndrome $s(\hat{x}^{(i)}) = H\hat{x}^{(i)}$.
Stopping Criterion:
Stop the iterations if $s(\hat{x}^{(i)}) = 0$ or $i = i_{max}$.

In the so-called "flooding scheduling", the horizontal and vertical steps of a LDPC decoding iteration are performed sequentially: first all the constraints are processed, then all the variables are processed.

Performing the horizontal (resp. vertical) steps can be achieved either by processing sequentially each of the graph constraint (resp. variable) node, or with the mean of a plurality of P processing units (in Richardson, T. and Novichkov, V. "Methods and apparatus for Decoding LDPC codes." U.S. Pat. No. 6,633,856 or in Boutillon, E. and Castura, J. and Kschischang, F. R. "Decoder-First Code Design", Proceedings of the 2nd International Symposium on Turbo Codes and Related Topics) processing in Q=M/P steps (also defined as macrocycles) the M constraints of the code.

Each processing unit can receive a set of input messages as a sequence of consecutive messages (serial computation) or alternatively as a set of simultaneous messages (parallel computation). The unit is consequently likely to process the data in a sequential ordering or alternatively in a more parallel ordering.

Let us focus on the Check Node Unit (CNU) that performs the horizontal step, i.e. that computes constraint to variable messages from variable to constraint messages.

In (Hu, X.-Y. and Eleftheriou, E. and Arnold, D.-M. and Dholakia, A. "Efficient Implementations of the Sum-Product Algorithm for Decoding LDPC Codes" Proceedings of the Global Telecommunications Conference, GLOBECOM 2001), the authors suggest that equations (3) and (4) can be implemented in parallel, using a tree structure. In (Boutillon, E. and Castura, J. and Kschischang, F. R. "Decoder-First Code Design", Proceedings of the 2nd International Symposium on Turbo Codes and Related Topics), the parity-check constraints are factored linearly in order to obtain a regular parallel architecture, which is more efficient and dynamically reconfigurable.

In parallel implementations, the computations of (3) and (4) are also replaced respectively by the equivalent forms (in Yeo, E. and Nikolic, B. and Anantharam, V. "Architectures and Implementations of Low-Density Parity-Check Decoding Algorithms" Proceedings of the International Midwest Symposium on Circuits and Systems, 2002):

$$M_{mn}^{(i)} = \Phi^{-1}\left\{\left(\sum_{n' \in N(m)} \Phi(Z_{mn'}^{(i)})\right) - \Phi(Z_{mn}^{(i)})\right\} \quad (8)$$

$$S_{mn}^{(i)} = \text{sign}(Z_{mn}^{(i)}) \times \prod_{n \in N(m)} \text{sign}(Z_{mn}^{(i)}) \quad (9)$$

with $$\Phi(x) = -\log\left(\tanh\left(\frac{|x|}{2}\right)\right) = \Phi^{-1}(x) \quad (10)$$

For example in (Yeo, E. and Nikolic, B. and Anantharam, V. "High Throughput Low-Density Parity-Check Decoder Architectures". Proceedings of the Global Telecommunications Conference, GLOBECOM 2001), (Blanksby, A. J. and Howland, C. J. "A 690-mW 1-Gb/s 1024-b, Rate-1/2 Low-Density Parity-Check Code Decoder" IEEE Journal of Solid-State Circuits, March 2002), (Kim, S. and Sobelman, G. E. and Moon, J. "Parallel VLSI Architectures for a Class of LDPC Codes" Proceedings of the International Symposium on Circuits and Systems, 2002) 2|N(m)| Look Up Tables (LUTs) are used for processing functions $\Phi(x)$ of equation (8).

In (Zhang, T. and Wang, Z and Parhi, K. K. "On Finite Precision Implementation of Low Density Parity Check Codes Decoder" Proceedings of the International Symposium on Circuits and Systems, 2001), the authors implement also a parallel Check Node Unit (CNU) but using another form for the update rules on the algorithm, which come from (Mackay, D. J. C. "Good Error-Correcting Codes Based on Very Sparse Matrices" IEEE Transactions on Information Theory, March 1999): updating work and complexity is more balanced between variable nodes processing and constraint nodes processing.

Alternatively to parallel architectures of the CNU, a sequential architecture can be used, featuring sequential designs of the CNU. The description of the constraint nodes update algorithm using equations (3) and (4) suits well to a sequential ordering of the computations. Alternative algorithms for decoding the constraint nodes of an LDPC code can take advantage of a sequential architecture of the CNU, for example:

a) the authors in (Yeo, E. and Pakzad, P. and Nikolic, B. and Anantharam, V. "VLSI Architectures for Iterative Decoders in Magnetic Recording Channels" IEEE Transactions on Magnetics, March 2001) implemented a serial parity-check processor using equations (8) and (9).

b) another technique, is to calculate the constraint to variable message information by the mean of a trellis (Mansour, M. M. and Shanbhag, N. R. "Low-Power VLSI Decoder Architectures for LDPC Codes" Proceedings of the International Symposium on Low Power Electronic Design, 2002).

The complexity of iterative decoder is now discussed in terms of its memory requirements: in general, a vertical iteration step needs the complete set of constraint to variable messages produced by the horizontal step, and vice-versa. In all the above-mentioned state of the art decoder realizations, at least one complete set of messages has to be stored. There are as many messages to be saved as the number of edges in the Tanner graph of the code. Additionally, the decoder needs all the received values from the channel to be stored during the whole iterative process.

In (Yeo, E. and Nikolic, B. and Anantharam, V. "High Throughput Low-Density Parity-Check Decoder Architectures" Proceedings of the Global Telecommunications Conference, GLOBECOM 2001), the authors suggest an implementation of a "staggered" method: the constraint to variable messages are not saved, so as to save memory. But the performances are drastically affected and the number of iterations is limited to a maximum of 4 or 5.

In (Chen, J. and Fossorier, M. P. C. "Decoding Low-Density Parity-Check Codes with Normalized APP-Based Algorithm" Proceedings of the Global Telecommunications Conference, GLOBECOM 2001), the authors propose a simplification of the constraint node update algorithm, called BP-based algorithm. It is mentioned that: "The BP-based algorithm also reduces the storage requirement, since for each constraint node cm, only the two smallest magnitudes of all $(Z_{mn}^{(i)})_{n \in N(m)}$ need to be stored for representation of all $(L_{mn}^{(i)})_{n \in N(m)}$". Yet the way to implement this algorithm is not disclosed. In the state of the art, there is no trivial architecture that leads to an efficient implementation of the algorithm proposed therein with the claimed memory savings.

Moreover, the drawback of this method is that the performance degradation can be significant for large irregular LDPC.

The state of the art of scheduling an iterative belief propagation algorithm is now discussed. The more straight-forward scheduling is the flooding scheduling. Alternatively, in (Zhang, I. and Fossorier, M. P. C. "Shuffled belief propagation decoding" Conference Record of the Thirty-Sixth Asilomar Conference on Signals, Systems and Computer, 2002), the authors propose another scheduling called "Shuffled-BP", and its extension to parallel processing called "Group-Shuffled BP".

The Shuffled-BP algorithm consists in the following sequencing of an iteration:

For each variable $v_n$(n=1 to N) do {
   1. horizontal step: update all the $L_{mn}$ values from constraints connected to $v_n$
   2. vertical step: update all the $Z_{mn}$ values to constraints connected to $v_n$
}

The Group-Shuffled BP is the extension of the Shuffled BP to groups of $N_G$=N/G consecutive columns processed simultaneously. Denoting G the number of groups and $N_G$ the number of variables in each group, the algorithm can be written as:

For each group g=1 to G do {
   horizontal step: update all the $L_{mn}$ values from constraints connected to variables n such that $G \cdot (g-1) < n \leq G \cdot g$
   vertical step: update all the $Z_{mn}$ to constraints connected to variables n such that $G \cdot (g-1) < n \leq G \cdot g$
}

In this algorithm, the processing is performed (group of) variable(s) by (group of) variable(s). For a given $L_{mn}$ to be computed at iteration i, those $Z_{mn'}$ having n'<n are produced by the i-th iteration, whereas those $Z_{mn'}$ with n'>n were produced by iteration i-1. In standard schedulings, all of the $Z_{mn'}$ values are dated from iteration i-1. The convergence of this algorithm is consequently faster (i.e. less decoding iterations are needed) than that of the flooding scheduled algorithms.

A major drawback of this method is that each constraint node computing process has to be split into as many sub-steps as there are variables connected to it, these sub-steps being possibly not consecutive in time because each of these sub-steps is processed when the decoder reaches a column (a bit) connected to that constraint. The authors of (Zhang, I. and Fossorier, M. P. C. "Shuffled belief propagation decoding" Conference Record of the Thirty-Sixth Asilomar Conference on Signals, Systems and Computer, 2002) mention that a "backward-forward" decomposition can be adopted to separate the partial results α and β. A practical implementation of the proposed decomposition would require either to save into a memory these partial results, or to recompute them for each step.

SUMMARY OF THE INVENTION

The present invention aims to overcome some of the above mentioned limitations.

In particular, the invention aims at achieving an implementation of an iterative LDPC decoder which is optimized in the sense of logic and storage complexity.

More specifically, it is a goal of the invention to reduce the storage requirements in an iterative LDPC decoder by means of a compression of the constraint to variable messages.

It is another goal of the invention to reduce the computational complexity of the constraint node processor by reducing the number of variable to constraint messages that are taken into account to produce the magnitude of the computed constraint to variable messages.

It is another goal of the invention to reduce the number of decoding iterations by means of using a novel scheduling including partial updates of the a posteriori information on variables.

It is another goal of the invention to provide a flexible constraint node processor implementation which allows the support of irregular codes and the support of different codes having different constraint degrees.

These goals as well as others that shall appear hereinafter are achieved according to the invention by means of a decoder of Low Density Parity Check codewords on GF($r^q$), said LDPC codewords, the decoder using the iterative belief propagation algorithm and comprising at least:

storing means to store a posteriori information on variables;

updating means to update the a posteriori information on variables;

first computation means to compute variable to constraint messages from a posteriori information on variables and variable to constraint messages from previous iteration;

second computation means to compute constraint to variable messages from variable to constraint messages computed by the first computation means; and third and fourth computation means to update the a posteriori information on variables; wherein the decoder comprises:

first shuffle means to transfer the a posteriori information on variables to the first computation means;

second shuffle means to transfer information from the third computation means to the fourth computation means; and compression-storage-decompression means of constraint to variable messages.

Here, the Belief Propagation (or BP) is an algorithm that propagates messages, related on probabilities on variables, between the constraint nodes and the connected variable nodes of a code.

Here, GF($r^q$) represents here a Galois Field over $r^q$ where r is a prime number and q an integer. The invention can be applied, for example, on GF(2), GF(4), GF(8) and more generally on GF($2^q$).

According to a particular characteristic of the decoder, at least one said second computation means takes into account a predetermined number of said variable to constraint messages which have the lowest magnitude level, this predetermined number being said $\lambda$.

Thus, the decoder enables compression of constraint to variable messages, because many constraint to variables messages should be identical.

Furthermore, the decoder requires less computational effort than in state of the art.

According to a particular characteristic of the decoder, at least one said second computation means outputs at least three different magnitudes of constraint to variable messages.

Thus, the decoder gives better performances than BP based algorithm of state of the art.

Furthermore, this feature enables a very few degradations of the performances of the LDPC decoder while reducing the complexity (typically less than 0.01 dB after 60 iterations for 64 kbits LDPC code with coding rate one half).

According to a particular characteristic of the decoder, the first computation means, the second computation means and the compression-storage-decompression means are gathered in parity check processing means, at least one parity check processing means comprising:

first decompression means to decompress constraint to variable messages of the previous iteration;

first computation means to compute variable to constraint messages from a posteriori information on variables and variable to constraint messages from previous iteration;

storage means to store compressed information representing constraints to variable messages;

pre-processing means to select lambda variable to constraint messages of lowest magnitude and respective references;

constraint to variable computation means to compute the lambda plus one different magnitudes of the constraint to variable messages generated; and second decompression means to generate the constraint to variable messages of the current iteration.

According to a particular characteristic of the decoder, the third computation means generates the difference between constraint to variable messages of the current iteration and the one of the previous decoding iteration, said differential constraint to variable information.

This mitigates the effect on conflictual accesses to the storage means of a posteriori information on variables.

According to a particular characteristic of the decoder, the third computation means generates an updated version of a posteriori information on variables.

This enables advantageously a horizontal shuffled belief propagation algorithm implementation. According to a particular characteristic of the decoder, the a posteriori information on variables is partially updated with constraint to variable information more than once during one decoding iteration.

This feature enables to implement a decoding algorithm that converges in less iterations than conventional flooding BP based scheduling.

This enables also a horizontal shuffled belief propagation algorithm implementation.

According to a particular characteristic of the decoder, the a posteriori information on variables is partially updated with constraint to variable information as many times as there are parity constraints connected to the variable.

This feature enables to implement a decoding algorithm (called horizontal shuffled) that converges in less iterations than conventional flooding scheduling.

According to a particular characteristic of the decoder, the information related to a constraint is transferred sequentially through the first and second shuffle means.

It enables an efficient implementation of the lambda-min algorithm.

According to a particular characteristic of the decoder, the sequential output order of the second computation means differs from its input order.

The invention relates also to a system comprising a decoder of Low Density Parity Check codewords on GF($r^q$), said LDPC codewords, said decoder using the iterative belief propagation algorithm and comprising at least storing means to store a posteriori information on variables on variables;

updating means to update the a posteriori information on variables;

first computation means to compute variable to constraint messages from a posteriori information on variables and variable to constraint messages from previous iteration;

second computation means to compute constraint to variable messages from variable to constraint messages computed by the first computation means; and third and fourth computation means to update the a posteriori information on variables; wherein the decoder comprises furthermore first shuffle means to transfer the a posteriori information on variables to the first computation means; and second shuffle means to transfer information from the second computation means to the storing means; and compression-storage-decompression means of constraint to variable messages and wherein the system comprises furthermore means of reception of Low Density Parity Check codewords.

This system is, for example, a radio receiver, a mobile terminal, a multimedia equipment or any system able to receive data transmitted or stored on any channel.

According to a particular characteristic, the system comprises furthermore means to handle digital data belonging to the group comprising:

data transmitted over a wireless channel;
data broadcast over a wireless channel; and
data stored on a medium.

Means to handle digital data are e.g. monitors, computation means, recorders, . . . . These data are, for instance, multimedia data such as image, sound, voice and/or file data. Wireless channel concerns mobile communication or wireless networks, or point-to-point link. Broadcast data concern point-to-multipoint transmission, and especially video broadcast (for example, according to the standard DVB-S2 (or "Digital Video Broadcast-Satellite Version 2").

Data stored on a medium are, for example, data stored on a magnetic and/or optical medium.

The system can be multiuser (e.g., for multidetection) or of MIMO type (Multiple Input Multiple Output).

The invention relates also to corresponding decoding method of Low Density Parity Check code words and computer program.

The advantages of the decoding method, of the computer program and of the system are the same as those of the decoder. They shall not be described in fuller detail.

BRIEF DESCRIPTION OF THE DRAWINGS

Other features and advantages of the invention shall appear more clearly from the following description of a preferred embodiment, given by way of a simple, exemplary illustration that in no way restricts the scope of the invention, and from the appended drawings, of which.

DETAILED DESCRIPTION OF THE PREFERRED EMBODIMENTS

The general principle of the invention is illuminated by the following modified belief-propagation algorithm, declined in its flooding scheduling version (A) and in its horizontal-shuffled scheduling (B). Those new scheduling allow to perform compression of constraint to variable messages.

The novel scheduling proposed, called "horizontal-shuffled", exhibits faster convergence than classical flooding schedule algorithm, and does not suffer from the need to store the intermediate values of Zhang, I. and Fossorier, M. P. C. "Shuffled belief propagation decoding" (Conference Record of the Thirty-Sixth Asilomar Conference on Signals, Systems and Computer, 2002).

A/ Modified-BP Algorithm Using a Flooding Scheduling:

Initialization: A-priori information is initialized: $Z_n^{(0)} \times F_n$ and set all the $L_{mn}^{(0)}$ to zero.

Figure 2:
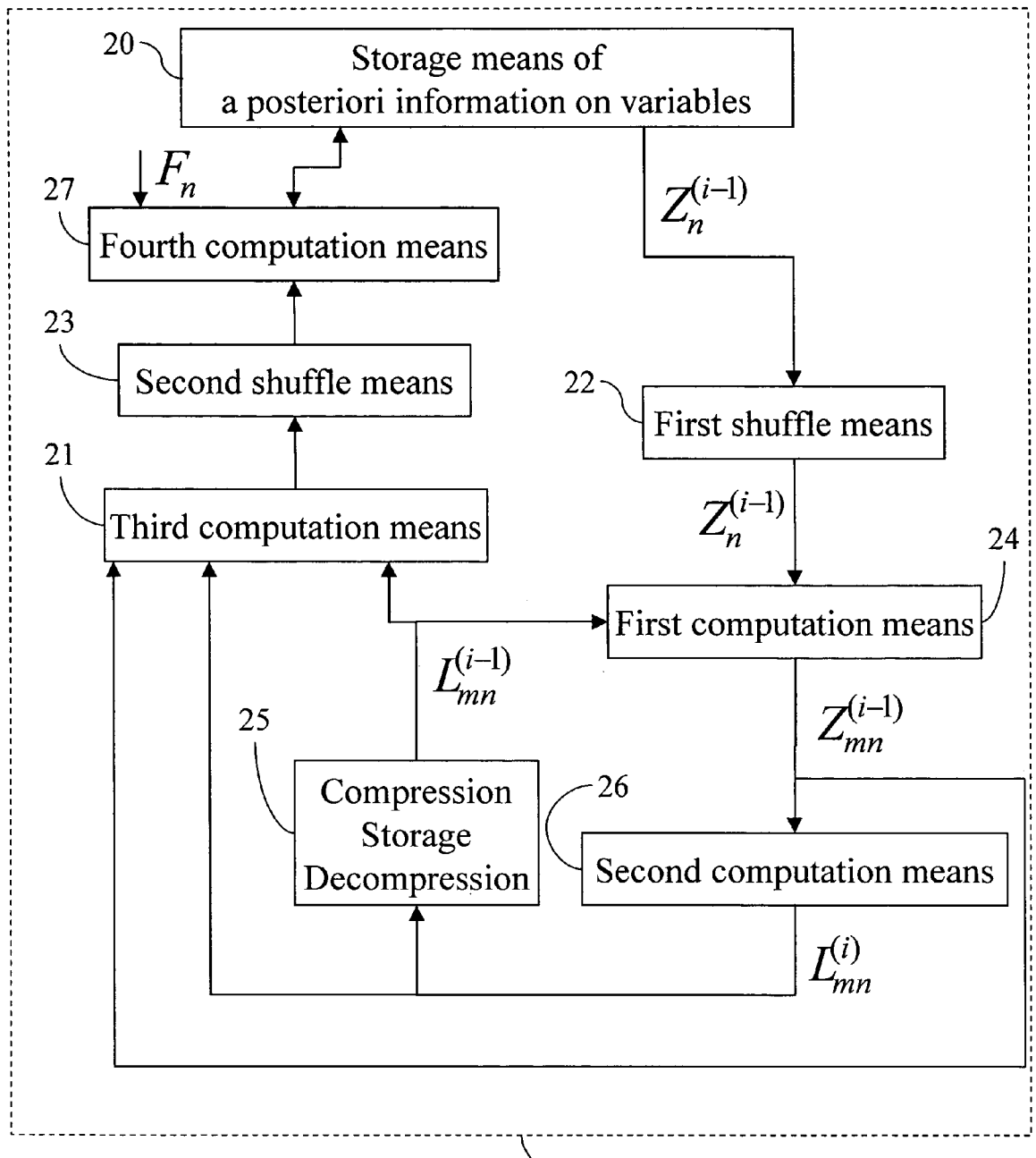
FIG. 2 presents a decoder according to the invention in the general case.

Iteration i (i=1 to $i_{max}$):

1/Horizontal step: for each constraint $c_m$ (m=1 to M) do { sub-step 1—Decompress the compressed constraint to variable message $L_{mn}^{(i-1)}$ of the previous iteration compressed and stored in sub-step 4.

sub-step 2—Computation of variable to constraint messages by a first computation means 24 (FIG. 2): for each $v_n \in N(m)$, compute:

$$Z_{mn}^{(i-1)} = Z_n^{(i-1)} - L_{mn}^{(i-1)} \qquad (11)$$

sub-step 3—Computation of constraint to variable messages $L_{mn}^{(i)}$ by a second computation unit 26, named CNU (FIG. 2) (Check Node Unit) from the variable to constraint messages using a suboptimal algorithm described hereafter.

sub-step 4—Compress the constraint to variable messages and store it up to the next iteration with a compress-storage means 25. (FIG. 2).

The decomposition in sub-step 3 and sub-step 4 is formal. Both steps can be merged in practice.

}

2/Vertical step: for each variable $v_n$ (n=1 to N) do { sub-step 1: Update a posteriori information on variables using the channel a priori information and the set of constraint to variable messages generated by the CNU.

$$Z_n^{(i)} = F_n + \sum_{m \in M(n)} L_{mn}^{(i)} \qquad (12)$$

}

3—Hard-decision and syndrome:

$$\hat{x}_i = \{\text{sign}(Z_n^{(i)})\}_{1 \le n \le N}$$

Calculate the syndrome $s_i(\hat{x}) = H\hat{x}_i$
Stopping criterion:
Stop the simulation if $s(\hat{x}_i)=0$ or $i=i_{max}$ B/ Modified-BP Algorithm Using Horizontal-Shuffled Scheduling.

Instead of updating all the variable to constraint messages (vertical step) before beginning the horizontal step, the horizontal-shuffled scheduling updates dynamically the variable to constraint messages from the constraints that have already been processed in the current iteration.

The following notations are introduced:

Let us choose an ordering of the set [1:M] that will determine the timing ordering of the constraints processes along the iteration. This ordering induces on each ensemble M(n) a local ordering. $f_n(k)$ (k=1 to the degree |M(n)| of the variable $v_n$) will denote this local ordering:

$f_n(1)$ is the constraint index of the first constraint processed among all the constraints connected to the variable $v_n$, $f_n(k)$ is the constraint index of the k-th constraint processed among all the constraints connected to the variable $v_n$.

$f_n(|M(n)|)$ is the constraint index of the last constraint processed among all the constraints connected to the variable $v_n$.

Figure 1:
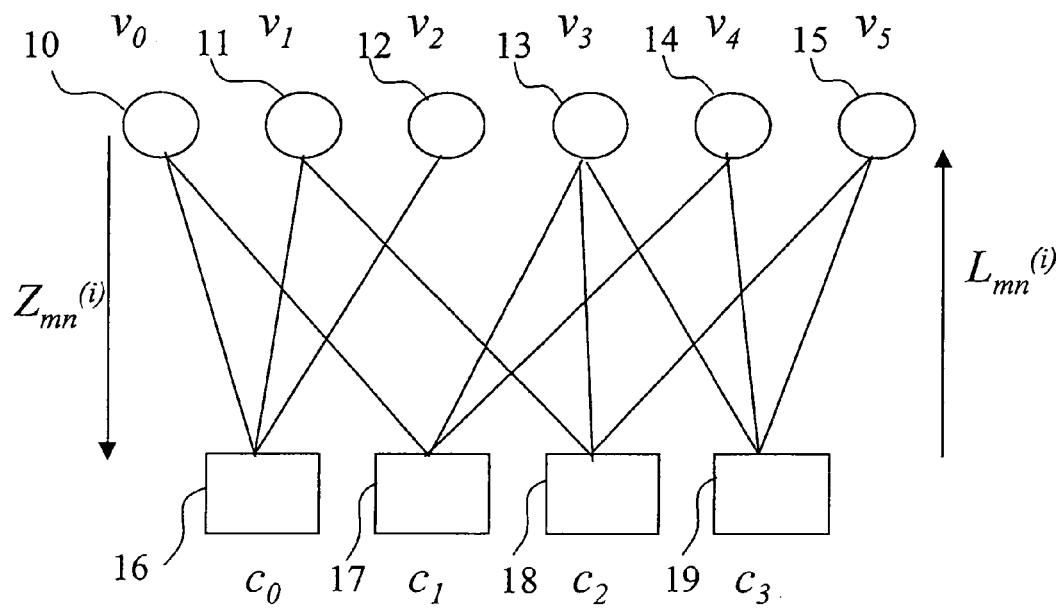
FIG. 1 illustrates an irregular LDPC known per se.

As an example, in FIG. 1, if the constraint are processed in the natural order ($c_0$ (16), $c_1$ (17), $c_2$ (18), $c_3$ (19)), then the functions are: $f_0(1)=0$, $f_0(2)=1$; $f_1(1)=0$, $f_1(2)=2$; $f_2(1)=0$, $f_3(1)=1$, $f_3(2)=2$, $f_3(3)=3$; $f_4(1)=1$, $f_4(2)=3$; $f_5(1)=2$, $f_5(2)=3$.

Conversely, if $m \in M(n)$, $j_0 = f_n^{-1}(m)$ represents the process order of the constraint $c_m$ relatively to the other constraints belonging to M(n).

For each iteration i and each $c_m \in M(n)$ we introduce:

$$Z_{mn}^{(i)} = F_n + \sum_{k<j_0} L_{f_n(k)n}^{(i)} + \sum_{k>j_0} L_{f_n(k)n}^{(i-1)} \qquad (13)$$

with $j_0 = f_n^{-1}(m)$.

For each j=1 to |M(n)|, we introduce:

$$Z_n^{(i)(j)} = F_n + \sum_{k<j} L_{f_n(k)n}^{(i)} + \sum_{k \ge j} L_{f_n(k)n}^{(i-1)} \qquad (14)$$

this value is to be interpreted as the a posteriori information on the variable $v_n$ being partially updated at iteration i by the j−1 first constraints.

The algorithm is then described by:

Initialization: A-priori information is initialized: $Z_n^{(0)}=F_n$ and all the $L_{mn}^{(0)}$ are set to zero.

Iteration i: For each constraint $c_m$ (m=1 to M) do { sub-step 1—Decompress the compressed constraint to variable messages $L_{mn}^{(i-1)}$ of the previous iteration.

sub-step 2—Computaton of variable to constraint messages by a first computation means (24): for each $v_n \in N(m)$, compute:

$$Z_{mn}^{(i-1)} = Z_n^{(i)(j_0)} - L_{mn}^{(i-1)} \text{ where } j_0 = f_n^{-1}(m). \qquad (15)$$

sub-step 3—Computation of constraint to variable messages $L_{mn}^{(i)}$ by a second computation means 26, named CNU (FIG. 2) (Check Node Unit) from the variable-to-constraint messages using a suboptimal algorithm described hereafter.

sub-step 4—Compress the constraint to variable messages and store it up to the next iteration with a compress-storage means 25 (FIG. 2).

sub-step 5—Update the a posteriori information on variable using the third and fourth computation means 21 and 27 of FIG. 2:

$$Z_n^{(i)(j_0+1)} = Z_{mn}^{(i)} + L_{mn}^{(i)} \qquad (16)$$

Note that if $j_0=|M(n)|$ then:

$$Z_n^{(i)(j_0+1)} = F_n + \sum_{k=1\ldots|M(n)|} L_{f_n(k)n}^{(i)} = F_n + \sum_{m \in M(n)} L_{mn}^{(i)} = Z_n^{(i+1)(1)}.$$

Alternatively, step 5 can be written as:

$$Z_n^{(i)(j_0+1)} = Z_n^{(i)(j_0)} + L_{mn}^{(i)} - L_{mn}^{(i-1)} \qquad (17)$$

or in more condensed formula:

$$Z_n^{(i)(j_0+1)} = Z_n^{(i)(j_0)} + dL_{mn}^{(i)} \qquad (18)$$

having introduced $$dL_{mn}^{(i)} = L_{mn}^{(i)} - L_{mn}^{(i-1)} \qquad (19)$$

the difference between the constraint to variable message of the current iteration and the one of the previous iteration.

sub-step 6—Syndrome sub-step:

$$\text{set } s_m^{(i)}(\hat{x}) = 0 \text{ if } \prod_{n \in N(m)} \text{sign}(Z_n^{(i)(f_n^{-1}(m))}) = 1 \text{ else } s_m^{(i)}(\hat{x}) = 1$$

}

Stopping Criterion:
Stop the iterations if $i=i_{max}$ or $\forall m\ s_m^{(i)}(\hat{x})=0$

C/ Detailed Description on the Suboptimal Constraint to Variable Computation Means: the λ-min Algorithm:

The constraint node processing algorithm is simplified by means of an efficient approximation called the lambda-min algorithm;

The constraint to variable nodes messages are stored using compression means, leading to a reduction of the storage requirements without suffering from the performance penalty of (Yeo, E. and Nikolic, B. and Anantharam, V. "High Throughput Low-Density Parity-Check Decoder Architectures" Proceedings of the Global Telecommunications Conference, GLOBECOM 2001).

From an implementation point of view, a significant part of the hardware complexity of a LDPC decoder lies on the memory required to store information messages of the belief propagation (BP) algorithm. In (Guilloud, F. and Boutillon, E. and Danger, J.-L. "λ-min Decoding Algorithm of Regular and Irregular LDPC Codes", 3$^{rd}$ International Symposium on Turbo Codes & related topics) we proposed a suboptimal algorithm named λ-min algorithm which enables to decrease the amount of memory required by the decoder without much performance degradation.

The parity check processing is complex because Look Up Tables (LUTs) are required to compute non-linear functions. The BP-Based algorithm proposed by M. P. C Fossorier et al. (Fossorier, M. P. C. and Mihaljevi'c, M. and Imai, I. "Reduced Complexity Iterative Decoding of Low-Density Parity-Check Codes Based on Belief Propagation" IEEE Transactions on Communications, May 1999) and more generally all the min-sum algorithms use an approximation of (3) which is replaced by:

$$M_{mn}^{(i)} = \min_{n' \in N(m)/n}(|Z_{mn'}^{(i)}|) \qquad (20)$$

In order to compensate the important loss of performance introduced by this simplification, an improvement is brought by adding a normalization coefficient or an offset (in Chen, J. and Fossorier, M. P. C. "Near Optimum Universal Belief Propagation Based Decoding of Low-Density Parity-Check Codes" IEEE Transactions on Communications, March 2002, and in Chen, J. and Fossorier, M. P. C. "Density Evolution for Two Improved BP-Based Decoding Algorithms of LDPC Codes" IEEE Communication Letters, May 2002) which modifies the evaluation of the constraint to variable information. But the loss of performance is still important, particularly for the codes which are closed to the Shannon limit (irregular codes, high length codewords).

The λ-min algorithm enables to fill the gap between the performance of the BP algorithm and those of the BP-based algorithm, allowing several different trade-offs between complexity and performance. See (Guilloud, F. and Boutillon, E. and Danger, J.-L. "λ-min Decoding Algorithm of Regular and Irregular LDPC Codes", 3$^{rd}$ International Symposium on Turbo Codes & related topics) for more details.

Equation (5) is modified so as to simplify its quantization:

$$I_0 \oplus I_1 = -\text{sign}(I_0)\text{sign}(I_1)\min(|I_0|,|I_1|) + f(I_0+I_1) - f(I_0-I_1).$$

Function $f: x \to f(x) = \ln(1+\exp(-|x|))$ is exponentially decreasing. Hence, the value of $L_{mn}^{(i)}$ in is mainly determined by the lowest $|Z_{mn}^{(i)}|$. This observation leads to the idea of taking into account only the λ (λ>1) variable to constraint messages which have the smallest magnitude in order to process the constraint node update.

Let $N_\lambda^{(i)}(m) = \{n_0, n_1, \ldots, n_{\lambda-1}\}$ be the subset of $N^{(i)}(m)$ which contains the λ indexes of the variable nodes implied in the constraint $c_m$ having the lowest magnitude of variable to constraint message at iteration i. Let also $\Omega_\lambda^{(i)}(m) = \{|Z_{mn}^{(i)}|, n \in N_\lambda^{(i)}(m)\}$ be the set of the λ minimum magnitudes of variable to constraint messages of constraint $c_m$ at iteration i. Finally, Let $S^{(i)}(m) = \{\text{sign}(L_{mn}^{(i)}), n \in N(m)\}$ denote the set of the signs of all constraint to variable information. Equation (3) is then approximated by:

$$M_{mn}^{(i)} = -\oplus_{n' \in N_\lambda^{(i)}(m)/n}(-|Z_{mn'}^{(i)}|) \qquad (21)$$

Equation (21) generates exactly λ+1 distinct values instead of |N(m)| in (3). The case λ=2 differs from BP-based algorithm for the variable nodes $n \in N_2^{(i)}(m) = \{n_0, n_1\}$, the λ=2 algorithm sending $Z_{mn_0}^{(i)} \oplus Z_{mn_1}^{(i)}$ to those variables, whereas the BP-Based algorithm sends simply $Z_{mn_0}^{(i)}$.

Let $E_\lambda^{(i)}(m) = \{e_j, j \in (0, 1, \ldots, \lambda)\}$ denote the set of λ+1 magnitudes of the constraint to variable messages produced by equation (21). Note that if j<λ.

$$e_j = -\oplus_{n' \in N_\lambda^{(i)}(m)/n_j}(-|Z_{mn'}^{(i)}|)$$

while $$e_\lambda = -\oplus_{n' \in N_\lambda^{(i)}(m)}(-|Z_{mn'}^{(i)}|)$$

A variant of the algorithm is to consider for each $n \notin N_\lambda^{(i)}(m)$, that equation (21) can be replace by:

$$e_\lambda = -\oplus_{n' \in N(m)}(-|Z_{mn'}^{(i)}|) \qquad (22)$$

Another variant of the proposed algorithm is to modify the produced magnitudes of constraint to variable messages by adding or subtracting a constant value (offset) or by using a normalization coefficient b as proposed by (Fossorier, M. P. C. "Iterative Reliability-Based Decoding of Low-Density Parity-Check Codes" IEEE Journal on Selected Areas in Communications, May 2001). In the case of the use of an offset b (positive or negative), equation (21) becomes:

$$M_{mn}^{(i)} = \text{Max}(-\oplus_{n' \in N_\lambda^{(i)}(m)/n}(-|Z_{mn'}^{(i)}|) - b, 0) \qquad (23)$$

D/ Architecture

The overall architecture of the LDPC decoder is described at a functional level in FIG. 2. It comprises:

first storage means (20) to store a posteriori information on variables first computation means (24) to compute variable to constraint messages from a posteriori information on variables and variable to constraint messages from previous iteration, second computation means (26) to compute constraint to variable messages from variable to constraint messages computed by the first computation means third (21) and fourth (27) computation means to update the a posteriori information on variables, first shuffle means (22) to transfer the a posteriori information on variables to the first computation means, second shuffle means (23) to transfer information from the third computation means (21) to the fourth computation means (27), compression-storage-decompression means (25) of constraint to variable messages.

An important issue in LDPC decoder implementations lies on the possibilities to perform a parallel computing of a plurality of constraint nodes and a plurality of variable nodes. The proposed architecture is naturally adapted to implement parallelism:

each of the computational units can implement a plurality of identical sub-units, those sub-units being able to process a different constraint or variable at the same time.

the first and second shuffle deals with a plurality of simultaneous messages. It is modified to include a mean to rearrange the plurality of messages by means of applying a given predetermined permutation, as described for example in (Boutillon, E. and Castura, J. and Kschischang, F. R.

Figure 2A:
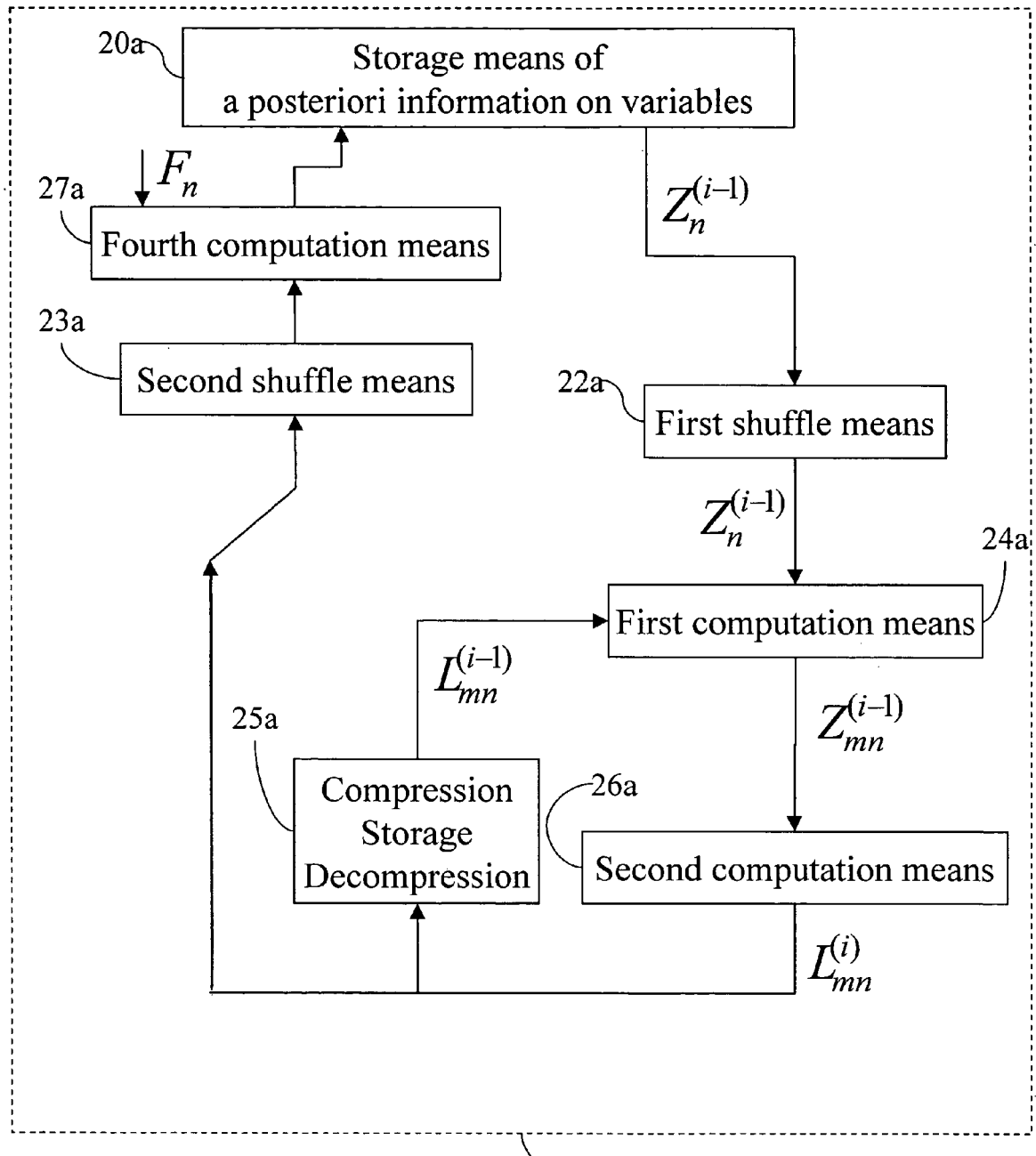
FIGS. 2a to 2c present a decoder according to the invention in different particular embodiments.

"Decoder-First Code Design" $2^{nd}$ International Symposium on Turbo Codes and Related Topics).

the storage means of a posteriori information on variables (20) can be accessed with a plurality of messages (in read and write modes of operation). Three main alternative variants of the architecture are described hereafter (FIGS. 2a, 2b and 2c):

ArchiVar-1 (FIG. 2a): The third computation means is bypassed. The information exchanged through the second shuffle means is a constraint to variable message $L_{mn}^{(i)}$. The fourth computation means (27a) implements the equation (12).

ArchiVar-2 (FIG. 2b): the information exchanged through the second shuffle means is an a posteriori information on variable $Z_n$. The third computation means (21b) implements equation (16).

ArchiVar-3 (FIG. 2c): The third computation means computes the difference between the current iteration constraint to variable message and the corresponding value of the previous iteration denoted $dL_{mn}$ (equation (19)). This information is then passed to the second shuffle means (23b). The fourth computation means takes as input the "un-shuffled" $dL_{mn}$ and implements equation (18). An additional "read" connection connects (27c) to (20c).

The architectural variant ArchiVar-1 can typically be adopted with a flooding scheduled decoding, and represents an amelioration of the architecture described in (Boutillon, E. and Castura, J. and Kschischang, F. R. "Decoder-First Code Design" $2^{nd}$ International Symposium on Turbo Codes and Related Topics) and (Zhang, T. and Parhi, K. K. "VLSI implementation-oriented (3,k)-regular low-density parity-check codes" Workshop on Signal Processing Systems, SIPS 2001), since the constraint to variable message is compressed before storage. This compression allows memory reduction without significant performance degradation.

The architectural variants ArchiVar-2 and ArchiVar-3 allows an efficient implementation of the proposed horizontal shuffled scheduling.

1) Architecture Description of the λ-min Algorithm

The simplification brought by the λ-min algorithm enables to lower the complexity of the architecture.

During one iteration, the M constraint nodes are processed in a given number Q of macrocycles, a macrocycle being defined as the time duration to process a plurality P of simultaneous constraints. The number of macrocycles is then given by: Q=M/P. The time scheduling of a macrocycle is presented in FIG. 8.

Note that in the following a constraint $c_m$ (resp. a variable $v_n$) can be abusively denoted with its sole index m (resp. n) to avoid to overburden the notations.

Figure 3:
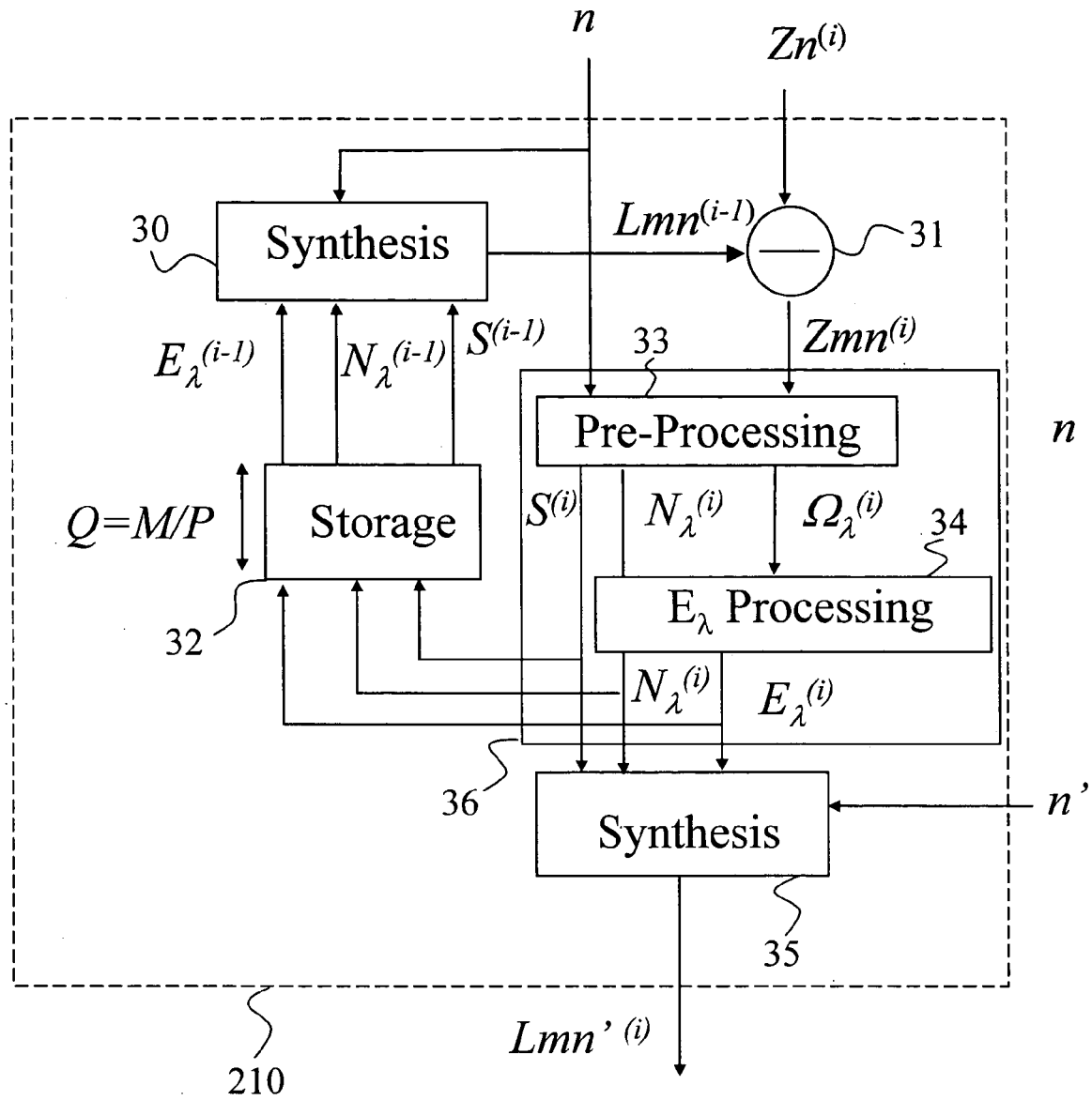
FIG. 3 presents CNU, Compress-Store-Decompress means and first computation means according to the invention in a particular embodiment of the invention.

FIG. 3 depicts the synoptic scheme of a possible realization of the λ-min algorithm. In this particular realization, the CNU (36), the Compress-Store-Decompress means (C.S.D.) and the first computation means are grouped in a single component that will be named Parity Check Processor (PCP) in the sequels. This PCP work in a serial mode, i.e. the a posteriori information on the variable arrives sequentially in the PCP. This serial arrival implies to choose a predetermined ordering between these messages. In FIGS. 3, 4, 5, 6 and 7, the index n will be related to the $n^{th}$ variables that arrive in the PCP (n varies from 1 to |N(m)|). The input n indicates the arrival of the $n^{th}$ a posteriori symbol information on variable. The input n' is a request to output the constraint to variable message associated to the $n'^{th}$ variable. The processing-is divided into 5 steps which may be pipelined:

Step 1) First computation means (31): A subtractor computes the $Z_{mn}^{(i-1)}$ according to equation (11). The $L_{mn}^{(i-1)}$ are generated by the C.D.S. unit (30) according to step 4 using the information saved in (32) during step 5 of the previous iteration.

Step 2) Pre-Processing (33): serial sorting of the λ lowest magnitudes $|Z_{mn}^{(i)}|$ to generate the set $\Omega_\lambda^{(i)}(m)$ and $N_\lambda^{(i)}(m)$ and calculation of the signs $S^{(i)}(m)$.

Step 3) Processing (34) of the λ+1 magnitudes of the set $E_\lambda^{(i)}(m)$ using the λ magnitudes of the set $\Omega_\lambda^{(i)}(m)$ using equation (21) or (22) or (23).

Step 4) Synthesis (35): Constraint to variable information $|L_{mn}^{(i)}|$ is generated during this step from the data $N_\lambda^{(i)}(m)$, $E_\lambda^{(i)}(m)$ and $S^{(i)}(m)$.

Step 5) Storage means (32): saving data $N_\lambda^{(i)}(m)$, $E_\lambda^{(i)}(m)$ and $S^{(i)}(m)$ in the stack of size Q=M/P so as to recover the $L_{mn}^{(i)}$ in the iteration i+1.

Step 6) Decompression means (30): the decompression means is identical to the synthesis unit (35).

According to a variant, the storage means (32) is a FIFO.

According to another variant, the order of output of the C.D.S is not the order of input of the C.D.S.

According to another variant, the information stored in the C.D.S is $N_\lambda^{(i)}(m)$, $\Omega_\lambda^{(i)}(m)$ and $S^{(i)}(m)$. In that case, the decompression means (30) also includes a $E_\lambda$ Processing means identical to (34).

According to another variant, the a posteriori information on the variable arrive sequentially two by two in the PCP.

According to another variant, the a posteriori information on the variable arrives sequentially r by r, with r an integer above 2 in the PCP.

Many possible variants exists and are in the scope of the patent.

Figure 4:
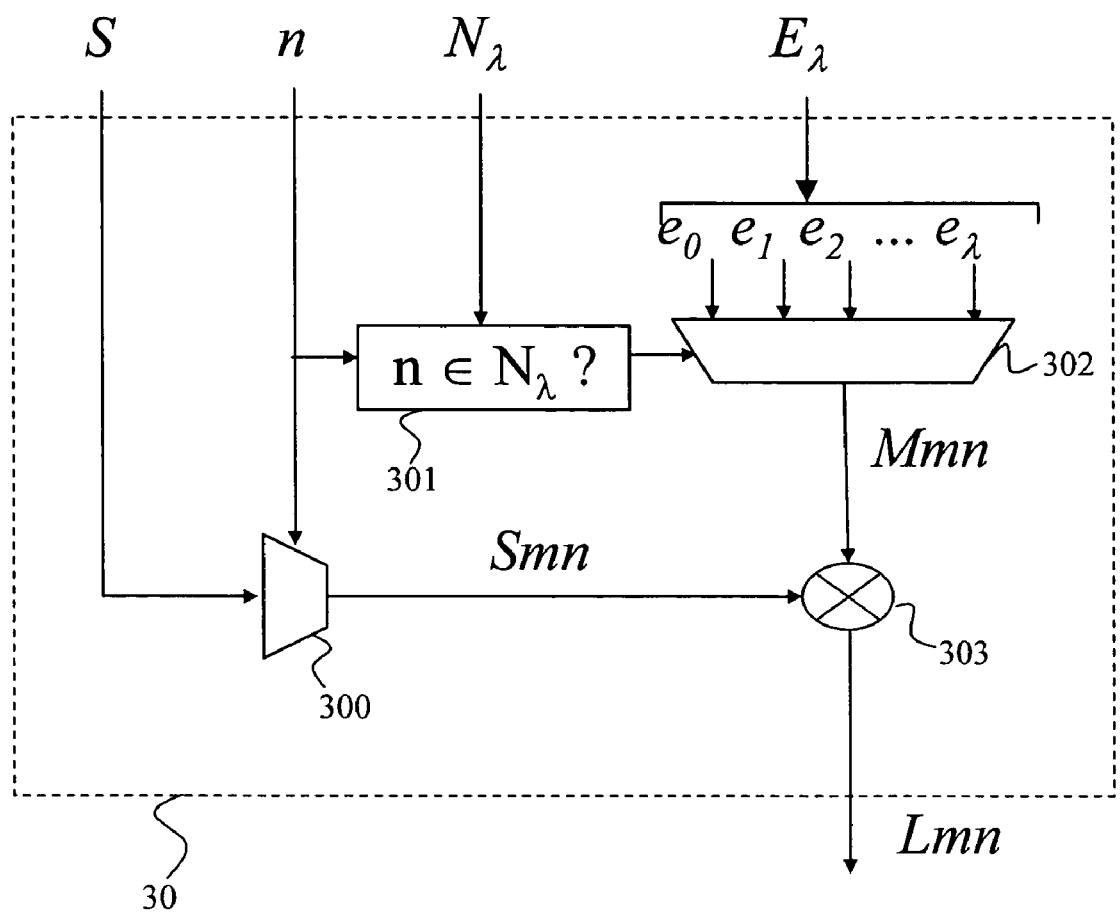
FIG. 4 describes a synthesis block implemented in the decoder of FIG. 3.

FIG. 4 presents an example of a decompression means (named synthesis in FIG. 3, i.e. (30) and (35)). This component receives two kinds of inputs: first the information coming from the storing means of the C.S.D, i.e. $N_\lambda^{(i-1)}(m)$, $E_\lambda^{(i-1)}(m)$ and $S^{(i-1)}(m)$, second, the index n of the constraint to variable message to be processed. The multiplexer (300) enables the selection of the sign of $L_{mn}^{(i-1)}$ among the |N(m)| values of S. The index n is compared in (301) with the λ indexes of set $N_\lambda^{(i-1)}(m)$ in order to generate the appropriate command of the multiplexer (302). The output of the multiplexer (302) is thus the magnitude $M_{mn}^{(i-1)}$. The multiplier (303) multiplies sign and magnitude in order to obtain the final constraint to variable message $L_{mn}^{(i-1)}$.

Figure 5:
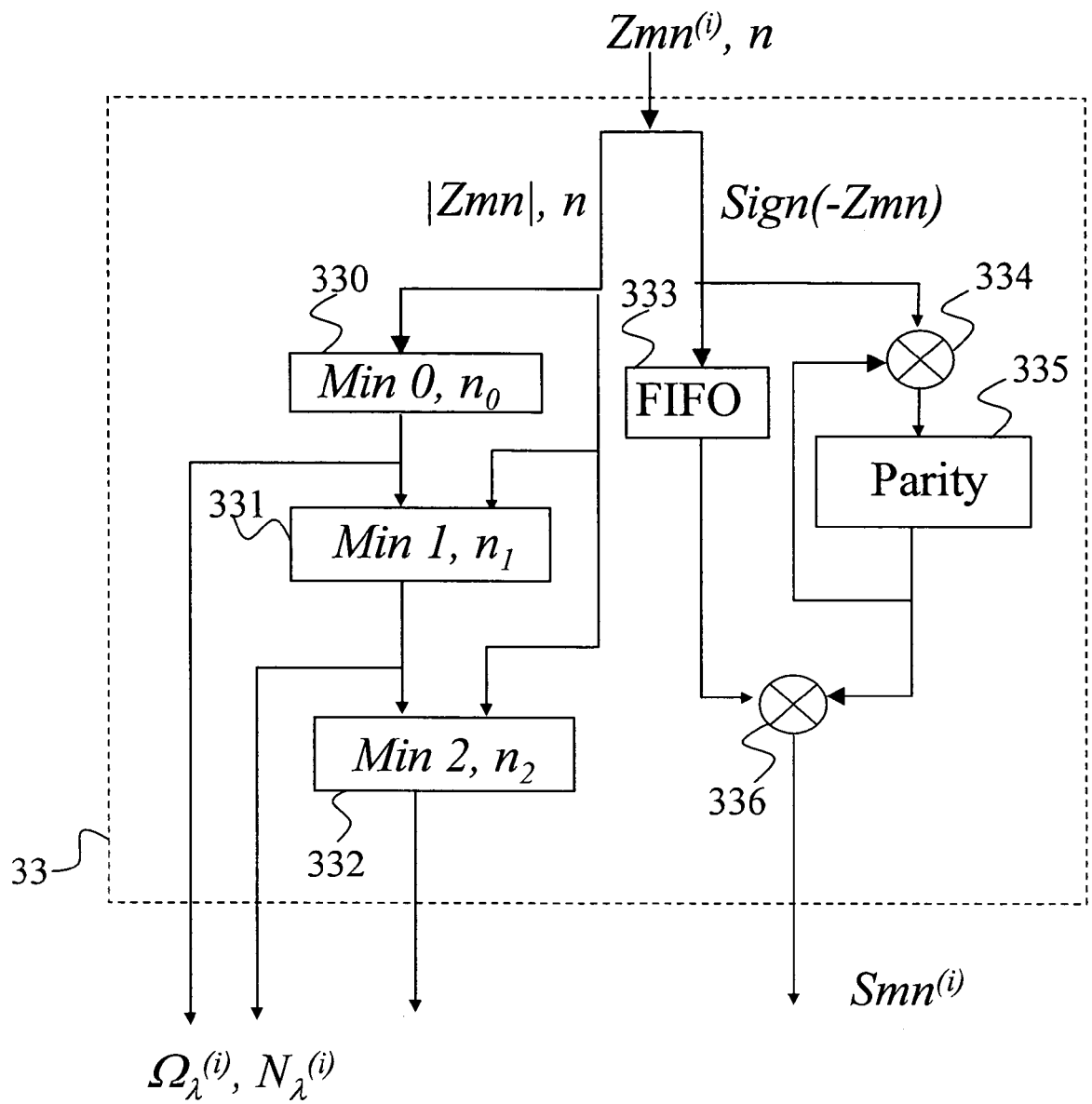
FIG. 5 illustrates a pre-processing block implemented in the decoder of FIG. 3.

FIG. 5 depicts a possible realization, among many different possibilities, of the pre-processing block (33) for the case λ=3. It features a serial sorting of the incoming variable-to-constraint messages. This sorting is performed using a succession of λ=3 elementary operators 430, 431 and 432. Every clock cycle, the magnitude $|Z_{mn}^{(i)}|$ of $Z_{mn}^{(i)}$ is compared with the previous results saved in the operator. Depending on the result of the comparison, it is inserted in the decreasing order, loosing the highest one.

This block features also a memory (433) (FIFO) to save all the incoming signs and a XOR (334) loop to compute the parity (335) $P_m^{(i)}$ of the constraint. Finally the XOR (336) computes $S_{mn}^{(i)}$.

Figure 6:
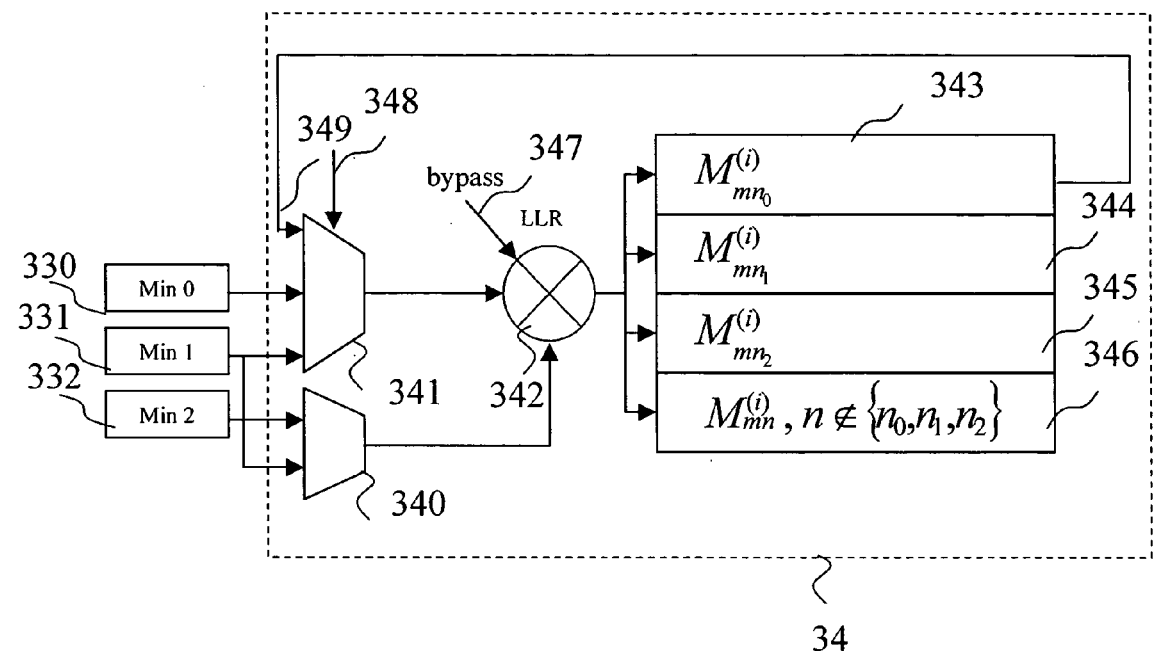
FIG. 6 shows the $E_\square$ processing in the decoder of FIG. 3.

FIG. 6 depicts an example, among many different possibilities, on how the processing of equation (21) can be implemented. The magnitudes of the constraint-to-variable message of the set $E_\lambda^{(i)}(m)$ are processed serially with the 2-input operator (642) that perform the function $\oplus$ of equation (6). The control (649) on the multiplexors (640) and (641) is sequenced so that: the Min 1 (631) $\oplus$ Min 2 (632) is processed on the first cycle and saved in (643), then Min 0 (630) ⊕ Min 2 (632) is compute during the second cycle and saved in (644), then Min 0 (630) ⊕ Min 1 (631) is computed on the third cycle and saved in (645), finally, during the fourth cycle, the value (Min 1 (631) ⊕ Min 2 (632)) computed during the first cycle and stored in (643) is feedback again to computeMin 0 (630) ⊕ (Min 1 (631) ⊕ Min 2 (632)) and store the value in (646).

Figure 7:
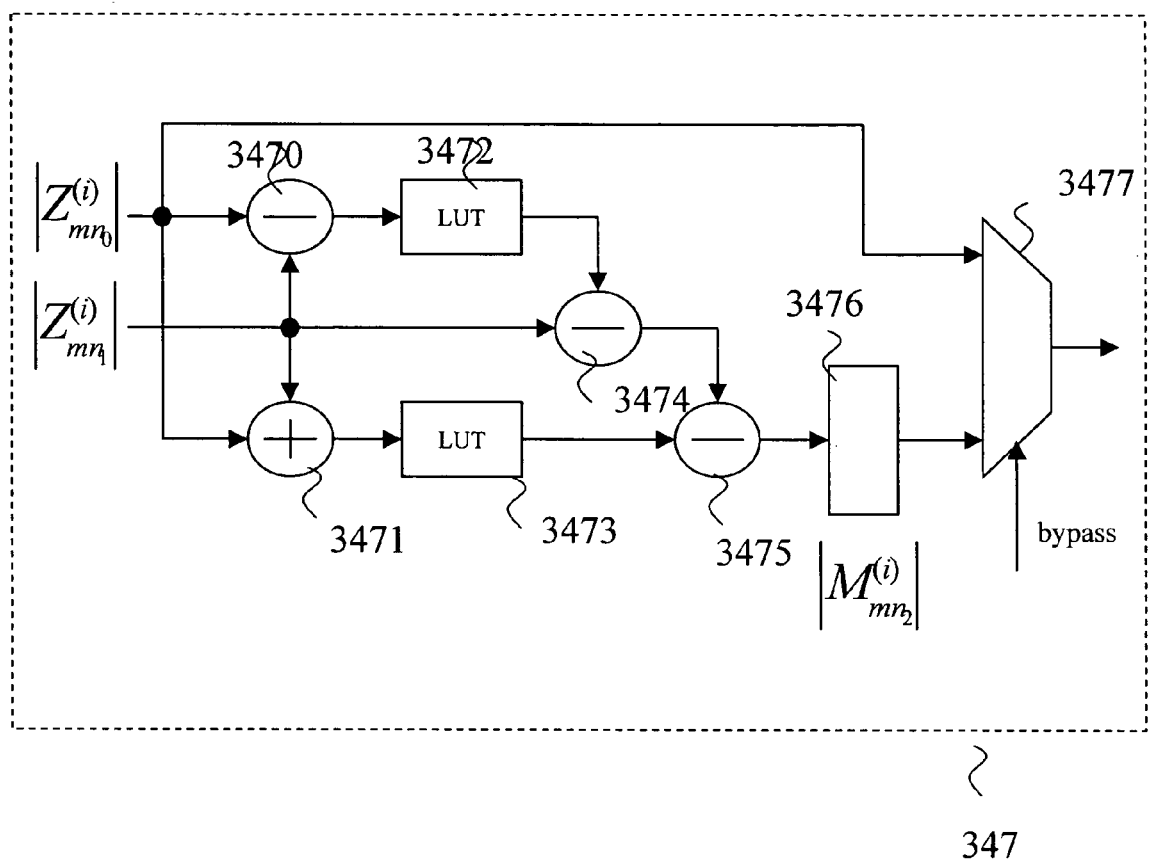
FIG. 7 presents an implementation of a 2-input constraint processing operator in the $E_\square$ processing of FIG. 6.

FIG. 7 depicts a possible realization of the LLR operator (342). The bypass (347) controls the multiplexor (77). The output of (342) is then either $|M_{mn}^{(i)}|$ saved in (76) or $|Z_{mn}^{(i)}|$. It is used for example if $|N(m)|<3$ or if $\lambda=2$ and $|N(m)|<4$. The LUT (72) and (73) are the image of equation $\ln(1+\exp(-|x|))$.

Figure 8:
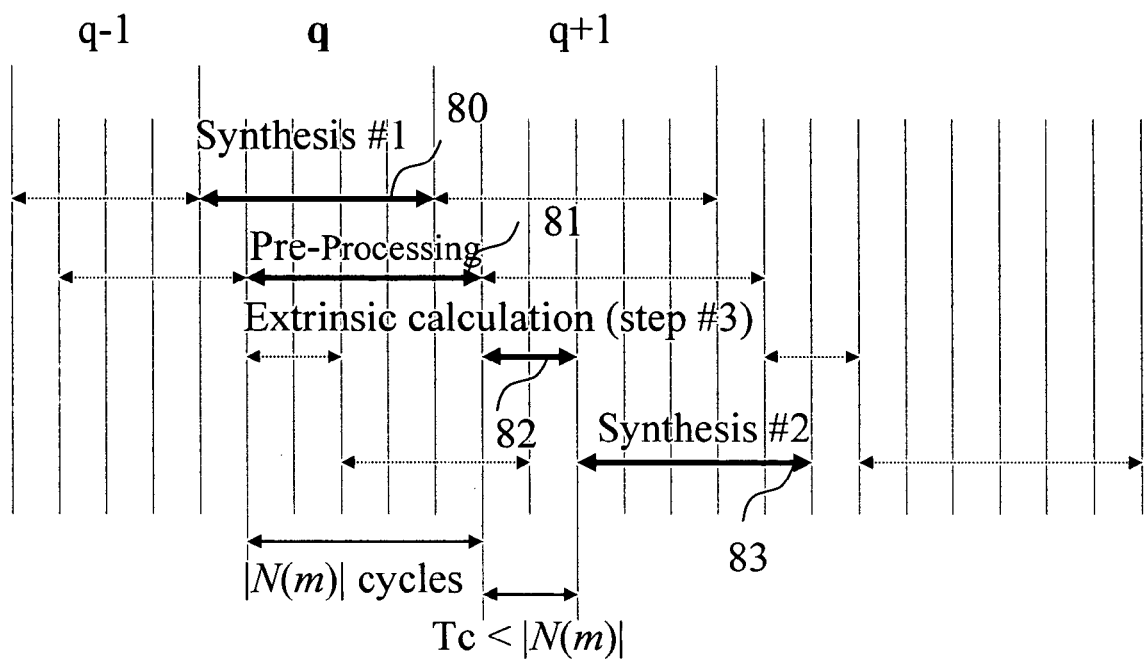
FIG. 8 describes a scheduling of the decoding process with the architecture of FIG. 3.

FIG. 8 describes the flow of operations in a PCP (210) during the processing of the $q^{th}$ macrocycle: (80) is the calculation time required by (30), (81) is the calculation time required by (33), (82) is the calculation time required by (34) and (83) is the calculation time required by (35). Each operation last $|N(m)|$ cycles, except for (82) (step 3 of 210). In step 3, $\lambda+1$ values have to be computed. The non-blocking constraint for a pipe-lined dataflow is that the calculation time should not last more than $|N(m)|$ cycles. If $|N(m)|<\lambda$, one has to notice that not all the $\lambda+1$ results of step 3 will be needed, to release the blocking constraint. As far as the irregular codes are considered, the constraint nodes just have to be processed in the growing order of their weight; otherwise, the $k^{th}$ operation of the macrocycle q might not be over when having to start the $k^{th}$ operation of the macrocycle q+1.

2) Memory Saving

In this part, $N_b+1$ denotes the number of bit used to code the constraint to variable messages ($N_b$ bits for magnitude and 1 bit for the sign). In state of the art implementations, a number $|N(m)|$ messages $Z_{mn}^{(i)}$ have to be saved for each constraint $c_m$, each of them being coded on $N_b+1$ bits. Hence, $(N_b+1)|N(m)|$ bits have to be saved for the next iteration for each constraint.

The simplification brought by the $\lambda$-min algorithm enables to reduce this amount of memory. The synthesis block of FIG. 3 is in charge of the decompression of this memory. Here is the decomposition of the amount of memory needed for the $\lambda$-min algorithm, for each constraint node:

1) $\lambda+1$ results of equation (21), i.e. $(\lambda+1)N_b$ bits.
2) $\lambda$ addresses on $\lambda$ elements of the set $N_\lambda^{(i)}(m)$ i.e.: $\lambda \log_2(|N(m)|)$ bits
3) $|N(m)|$ signs, i.e.: $|N(m)|$ bits.

The ratio between the two memories needed to save the extrinsic information in the case of the $\lambda$-minalgorithm and the BP algorithm for the constraint $c_m$ is:

$$\frac{(\lambda+1)N_b + \lambda\log_2(|N(m)|) + |N(m)|}{(N_b+1)|N(m)|} \quad (24)$$

Figure 9:
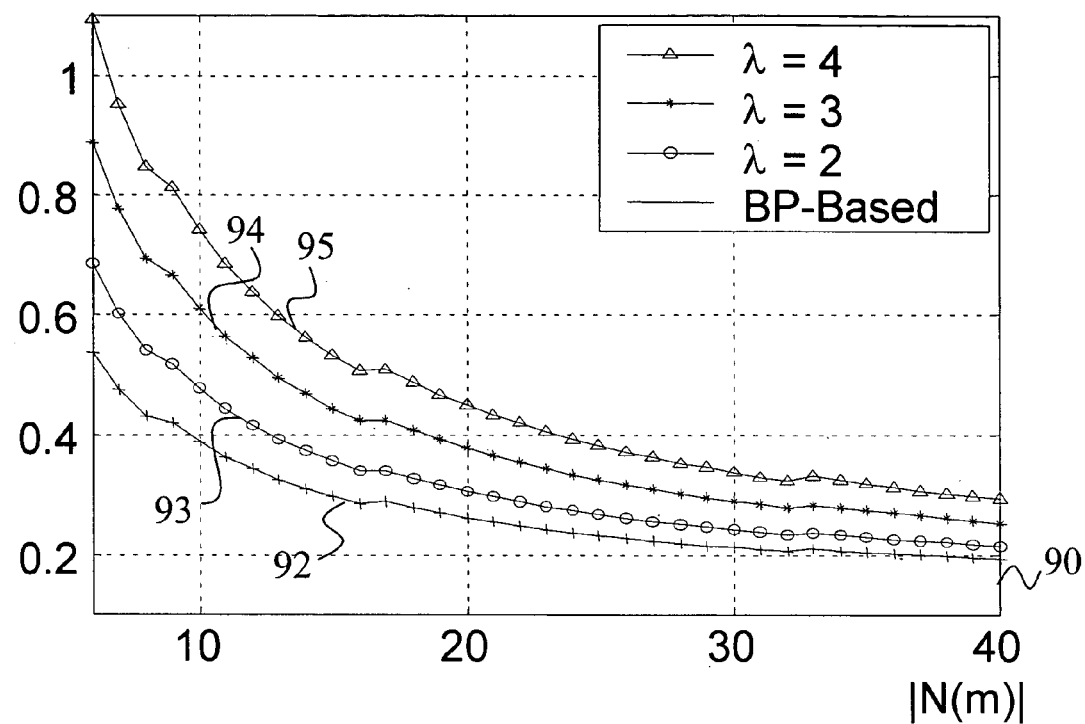
FIG. 9 shows the ratio of memory saving of the constraint to variable messages obtained with the architecture of FIG. 3.

FIG. 9 depicts the value of the ratio (24) as a function of $\lambda$ and $|N(m)|$. The curve 92 corresponds to the BP-based algorithm and the curves 93, 94 and 95 are for the $\lambda$-min algorithm with $\lambda=2$, 3 and 4 respectively. For example, in the case of a constraint $c_m$ with a weight $|N(m)|=20$ and for the $\lambda=2$-min algorithm (curve 93), the memory needed to save the constraint to variable messages is as much as 30% of the memory that would be needed with the BP algorithm.

Figure 10:
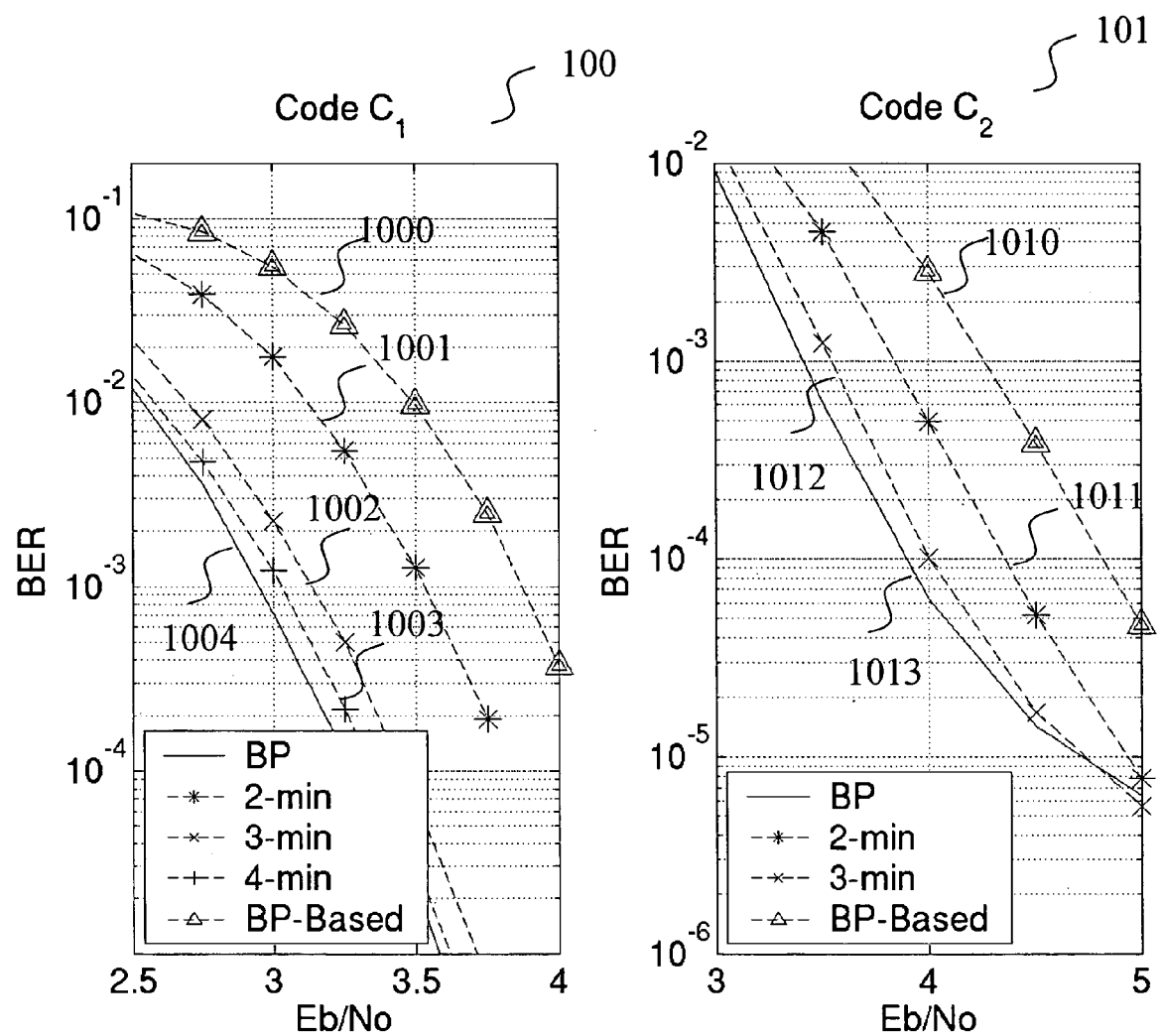
FIG. 10 presents some performance of the decoder of FIG. 2 compared to performance of decoders implementing other decoding methods.

FIG. 10 depicts the results obtained through simulations of the iterative decoding. Simulations have been performed using two different codes: $C_1$ and $C_2$. The code $C_1$ is a regular (5,10) LDPC code of length N=816, from (Mackay, D. J. C. "LDPC Database", Available at the World Wide Web address inference.phy.cam.ac.uk/mackay/codes/data.html and the code $C_2$ is an irregular LDPC code of length N=2000 and rate R=0.85. Its distribution degree is taken from (Urbanke, R. "LdpcOpt", Available at the World Wide Web address epfl.ch/research/ldpcopt/, code number 325). In this figure, the performance of $C_1$ (100) and $C_2$ (101) using respectively the BP (1004,1013), the $\lambda$-min for $\lambda=2$ (1001, 1011) $\lambda=3$ (1002,1012) and $\lambda=4$ (1003) and the BP-based (1004, 1013) algorithms are compared. A maximum of 50 decoding iterations are processed, unless the syndrome is found to be zero. As expected, the $\lambda$-min algorithm outperforms the BP-based algorithm and gets closer to the BP algorithm as $\lambda$ increases. For example, using the 3-min algorithm for the code $C_2$, which has constraint node degrees of 40 or 41, introduces a small degradation of 0.10 dB at a bit error rate of $10^{-4}$ (instead of 0.9 dB for the BP-based algorithm).

3) The $\lambda$ min Algorithm on LDPC Codes Constructed Over a Galois Field $GF(r^q)$ In the case of an LDPC code in a Galois Field $GF(r^q)$, where r is a prime number and q>0 an integer, the variable to constraint message from variable $v_n$ to constraint $c_m$ represent the a posteriori probabilities $(Z_{mn}^{(i)})(j)_{j=1...r^q}$ that the $n^{th}$ variable of the codeword is equal to the $j^{th}$ value of the Galois Field. Thus, the number of incoming message on the constraint $c_m$ is equal to $r^q|N(m)|$. The $\lambda$-min algorithm is then modified compared to the case of LDPC over GF(2).

a) The "hard decoding" of the variable to constraint message (the sign of $Z_{mn}^{(i)}$) is replaced by a hard decoding in $GF(r^q)$, i.e. the index $j_{mn}^{(i)}$ so that $(Z_{mn}^{(i)})(j_{mn}^{(i)})(j)$ j=1...$r^q$.

b) From the hard decoding, $r^q-1$ log-likelihood ratios can be computed as $\hat{Z}_{mn}^{(i)}(j)=(Z_{mn}^{(i)})(j_{mn}^{(i)})/(Z_{mn}^{(i)})(j)$ for $j \neq j_{mn}^{(i)}$ for each constraint to variable message.

The $\lambda$ minimum values of the log-likelihood ratio thus created are used to compute the constraint to variable messages. The same architecture as for LDPC over GF(2) can be used. They will differ only by their computational kernel.

4) The Horizontal-Shuffled BP Scheduling

The new scheduling proposed herein called horizontal-shuffled BP in the following, will now be emphasised.

Figure 2B:
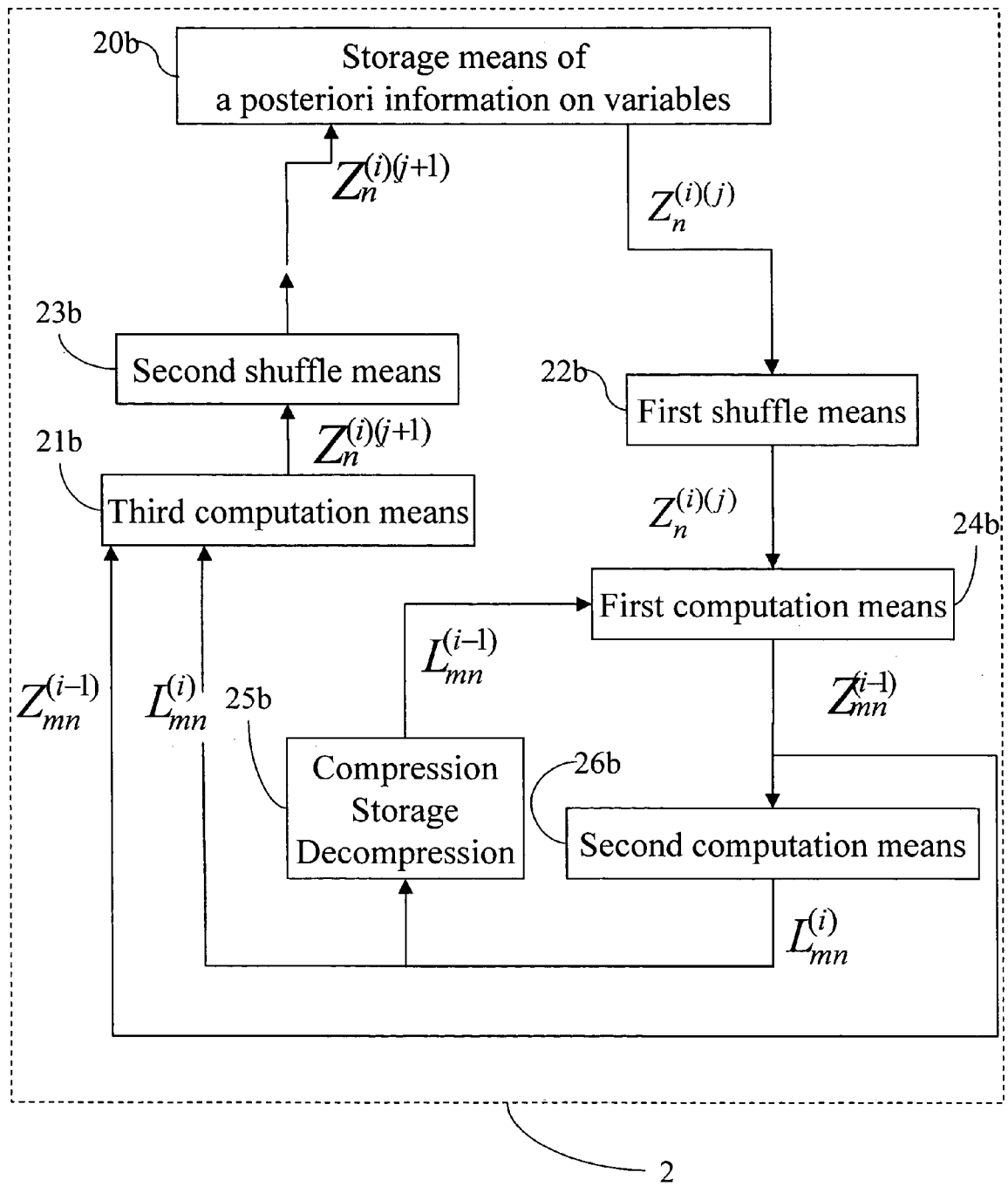

The architectural variant ArchiVar-2 presented in FIG. 2b is now described in more details.

Figure 11:
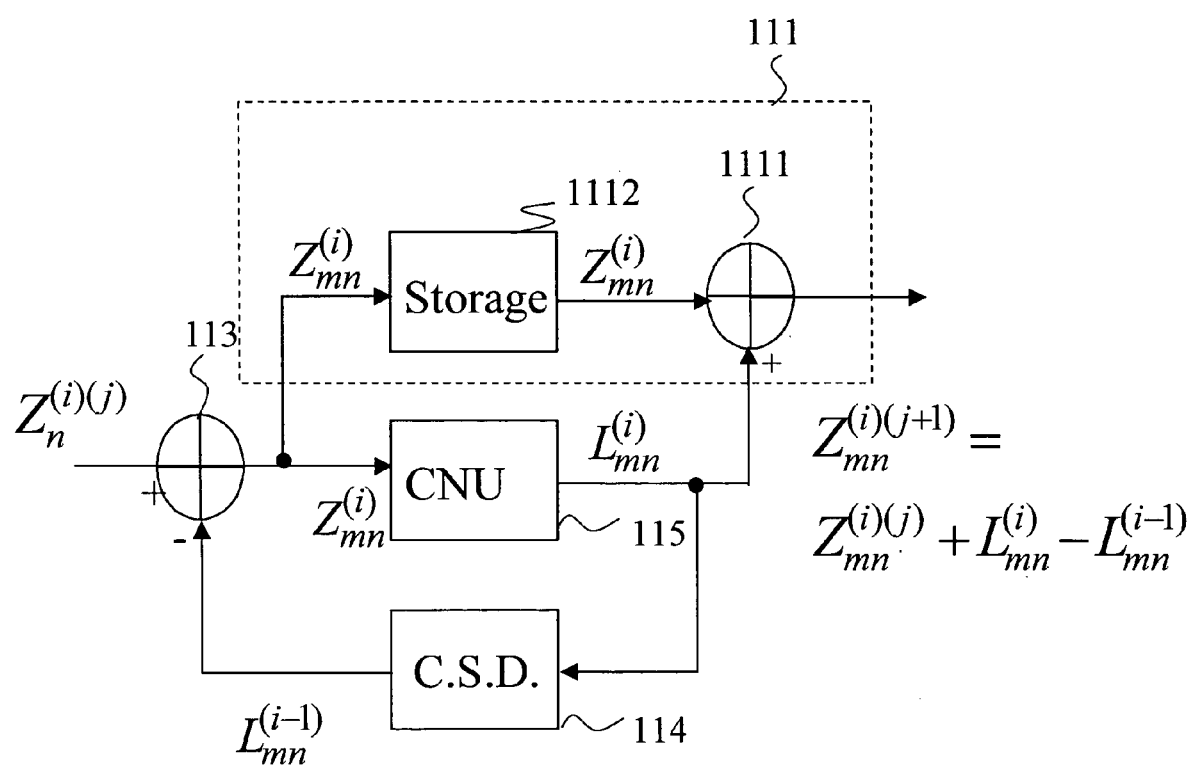
FIG. 11 presents alternative embodiments of parity check processor according to the invention for the horizontal shuffled scheduling.

In FIG. 11, the third computation means of FIG. 2b is now represented in (111), i.e. the update of the a posteriori information on variable, is at the CNU side of the second shuffle means. First the $Z_{mn}^{(i)}$ message are computed using the subtractor (113) from the incoming $Z_n^{(i)(j)}$ values of the first shuffle means and the value $L_{mn}^{(i-1)}$ of the C.D.S means (114). The $Z_{mn}^{(i)}$ messages are stored in a storage device (1112) while the CNU (115) computes the constraint to variable messages. The adder 1111 computes $Z_{mn}^{(i)}+L_{mn}^{(i)}$ in order to generate $Z_n^{(i)(j+1)}$, according to equations (16). Then, the updated a posteriori information on variable is shuffled with the second shuffle means to be stored in the first storage computation means.

According to a variant, the storage device (1112) can be a FIFO.

According to another variant, the storage device (1112) can change the order between input and output. The CNU is in this case operated also in a different output ordering with respect to its input ordering.

This architecture allows for the horizontal shuffled BP to be efficiently implemented, and has the advantage to completely avoid the storage of the variable to constraint messages.

5) Conflicts and Conflicts Resolution

A parallel architecture of a horizontal shuffled BP does not always guarantee for the algorithm described above to be implemented exactly because of the presence of conflictual accesses to the memory of a posteriori information on variables $Z_n$.

Figure 12:
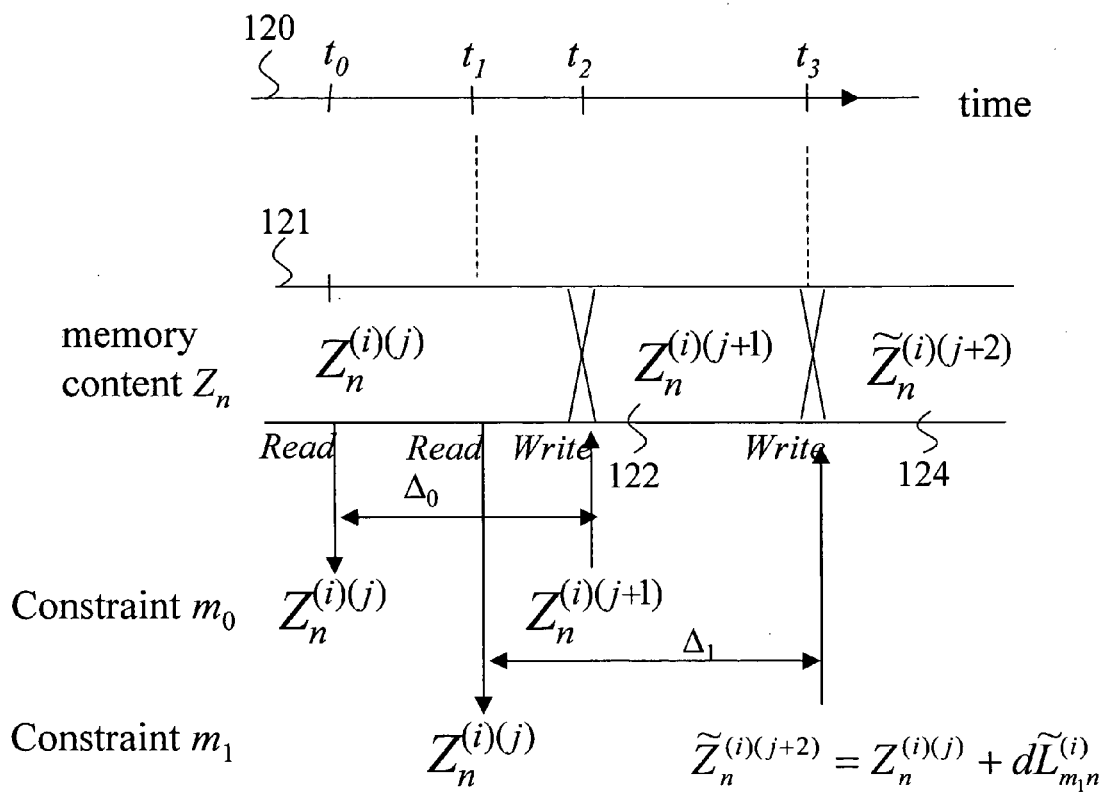
FIGS. 12 and 13 illustrate timing diagram examples of the content of a memory location in the context of partial updates of a posteriori information on variables.

FIG. 12 illustrates the conflict that can occur between two constraints $m_0=f_n(j)$ and $m_1=f_n(j+1)$ that are connected to the same variable n and accessed sequentially. The constraint process associated to constraint $m_0$ starts to read the initial value $Z_n^{(i)(j)}$ in the memory at time $t_0$, and writes the updated value $Z_n^{(i)(j+1)}$ after a given delay $\Delta_0$ (dependent on the constraint degree and the hardware implementation) at time $t_2=t_0+\Delta_0$. If during the time interval $[t_0, t_2]$, the constraint process associated to constraint $m_1$ starts, the value read by $m_1$ is $Z_n^{(i)(j)}$ instead of $Z_n^{(i)(j+1)}$. Thus, the algorithm will differ from the original horizontal-shuffled scheduling algorithm but this modification introduces no significant degradation: in fact, during the next iteration, the value will be updated. The main problem is that, after a delay $\Delta_1$, the write operation corresponding to $m_1$ at time $t_4=t_1+\Delta_1$ of the new updated value of the a posteriori symbol information will overwrite $Z_n^{(i)(j+1)}$. The information given by the constraint $m_0$ on the variable n is discarded and significant performance degradations are introduced. We will refer this situation to a "cut-edge conflict" (the edge of the Tanner Graph connecting variable n to constraint m0 is virtually absent in the decoding process).

The next section details the variant "ArchiVar-3" aiming at further reducing the effect of the conflicting situations.

Figure 2C:
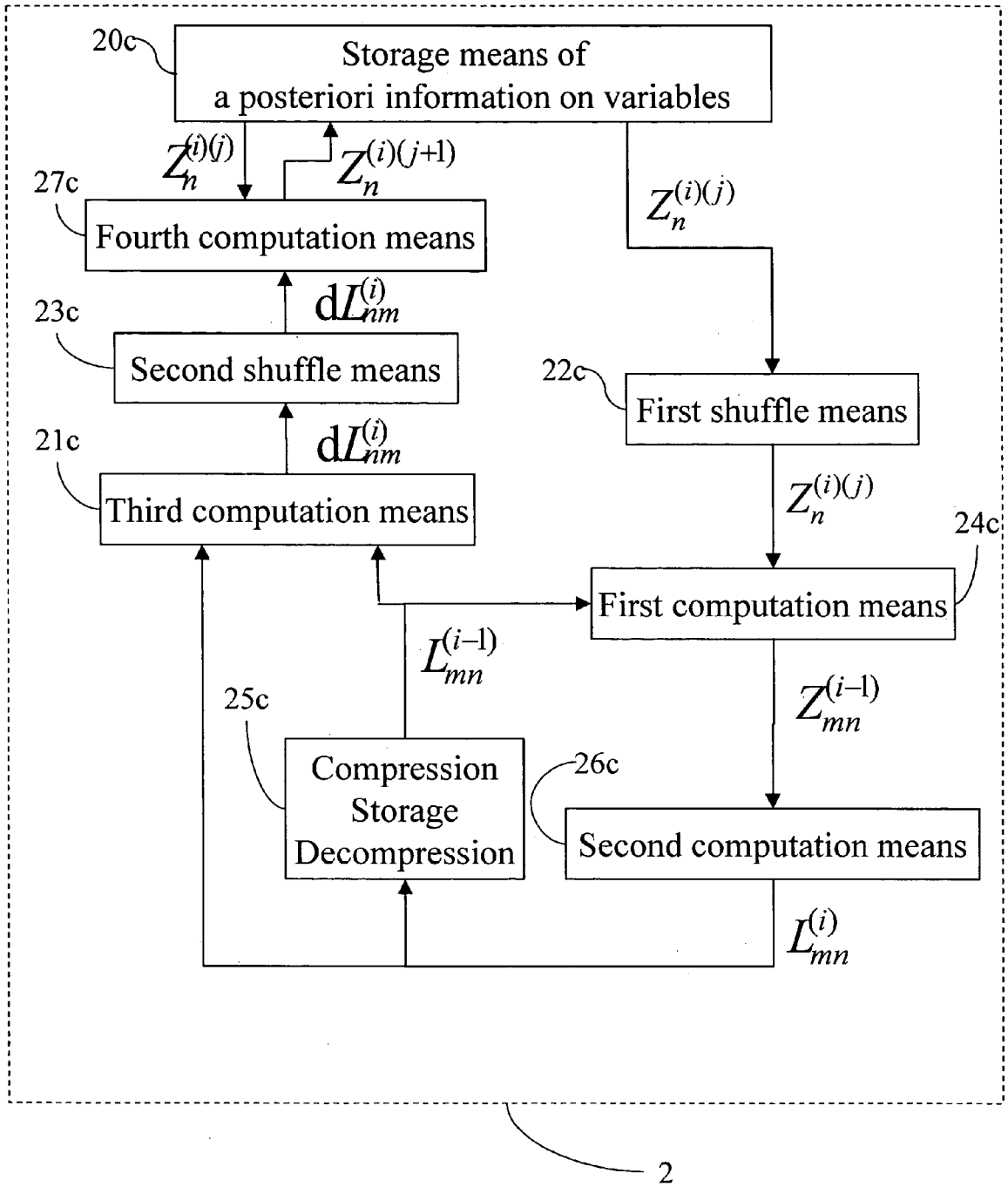

The functional view of the architectural variant "ArchiVar-3" is depicted in FIG. 2c. A detailed view on its specifics is provided by FIGS. (14a) and (14b).

The update of the a posteriori information on variable is performed in two steps. First, the $dL_{mn}^{(i)}$ is computed by the third computational means (141) according to equation (19). The second shuffle means is then applied to this set of values. The fourth computation means (147) performs the second step: update of the a posteriori information on variable by first reading the content of the corresponding variable in (146) and then by performing equation (18a) and (18b).

Figure 13:
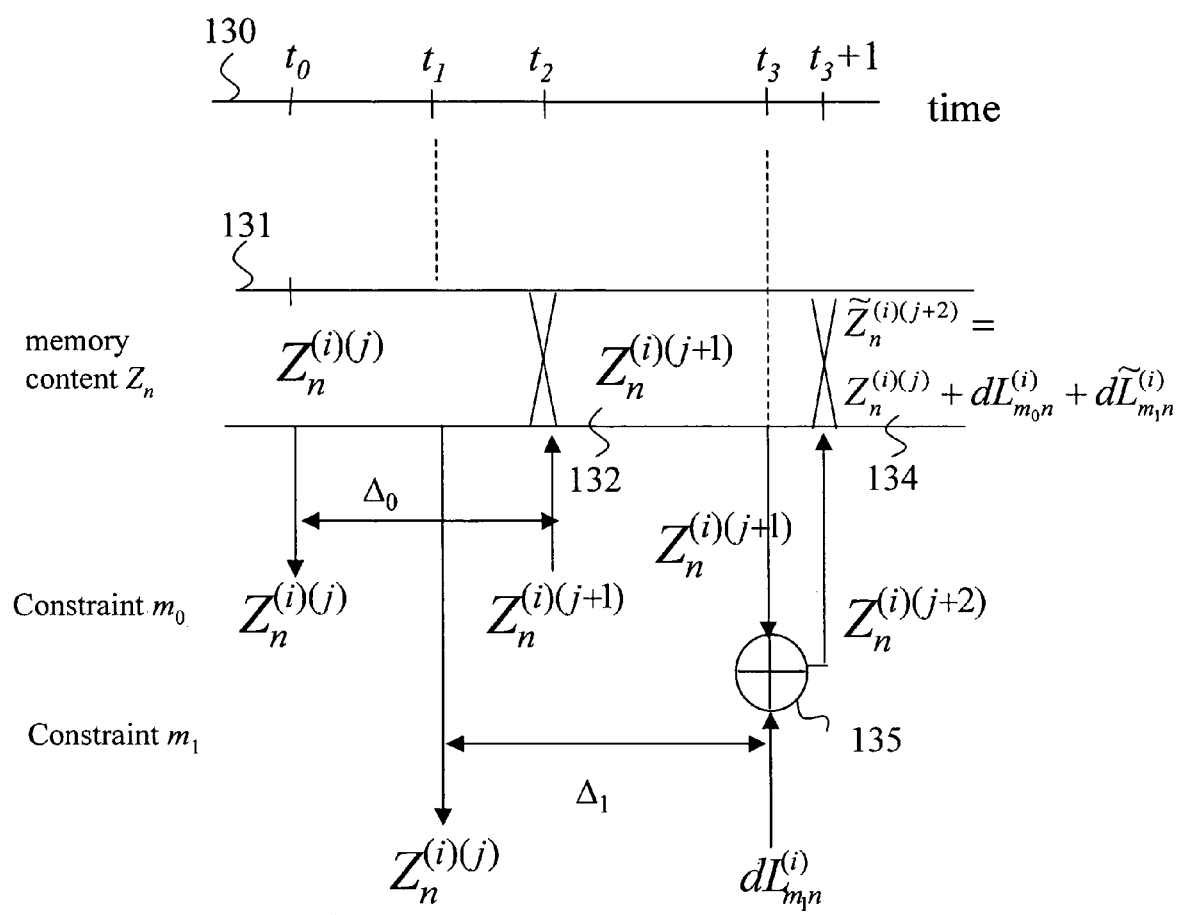
Figure 14A:
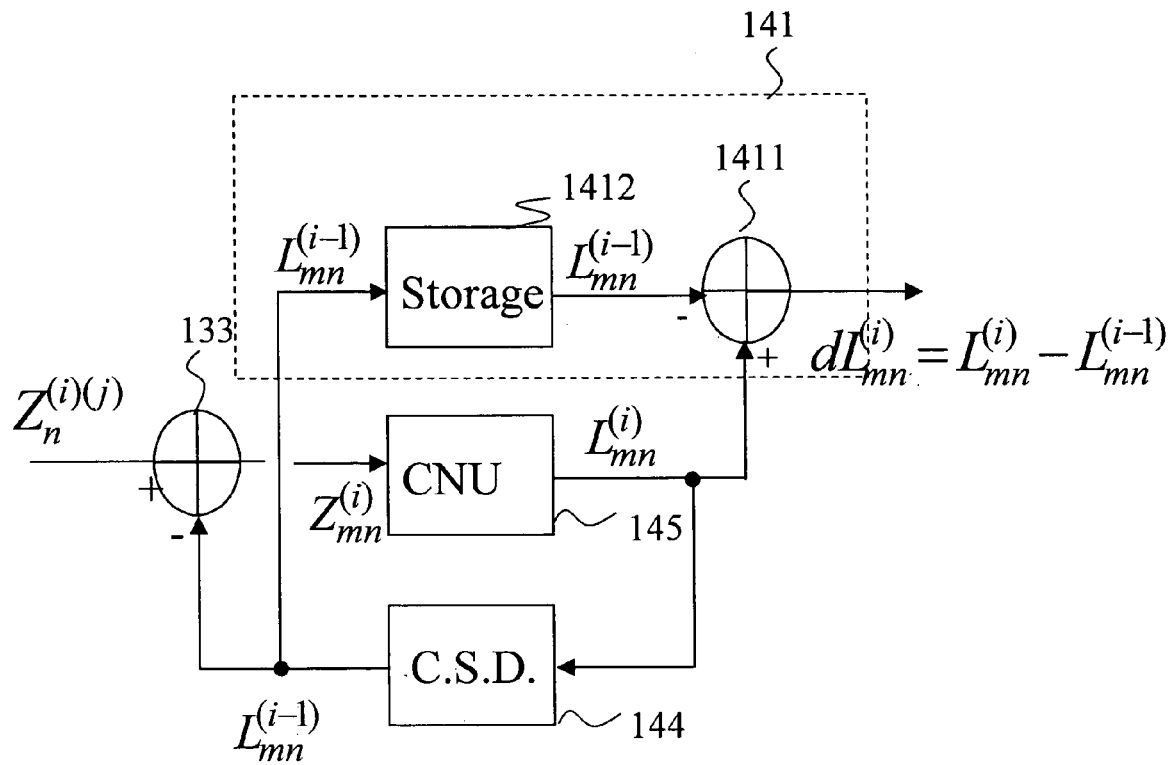
FIGS. 14a and 14b present an other alternative embodiment of a parity check processor according to the invention for the horizontal shuffled scheduling aiming at avoiding "cut edge conflicts"
Figure 14B:
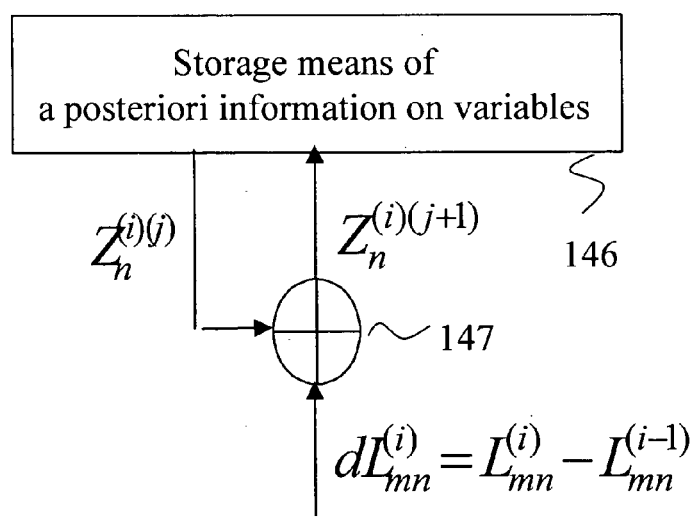

The timing diagram of FIG. 13 illustrates how the proposed architecture mitigates the effect of a conflict: After constraints m0 and m1 updates on Zn, the a posteriori information should be:

$$Z_n^{(i)(j+2)}=Z_n^{(i)(j)}+dL_{m_0 n}^{(i)}+dL_{m_1 n}^{(i)}$$

At time $t_3$, the read operation performed by (147) allows the final result to be:

$$\tilde{Z}_n^{(i)(j+2)}=Z_n^{(i)(j)}+dL_{m_0 n}^{(i)}+d\tilde{L}_{m_1 n}^{(i)}$$

instead of:

$$\tilde{Z}_n^{(i)(j+2)}=Z_n^{(i)(j)}+d\tilde{L}_{m_1 n}^{(i)}$$

which would be the result according to the ArchiVar2 variant.

This means that ArchiVar3 does not suffer from a "cut-edge" penalty on the edge $(m_0, n)$, unlike ArchiVar2.

A minor modification of the algorithms is persistent in both cases: $dL_{m_1 n}^{(i)}$ is approximated by $d\tilde{L}_{m_1 n}^{(i)}$.

The performance penalty of this approximation is not significant since $d\tilde{L}_{m_1 n}^{(i)}$ can be considered as a "not completely up-to-date" version of $dL_{m_1 n}^{(i)}$.

A further method is then described aiming at reducing the number of conflicts, taking into account a given code and decoder design. This invention proposes to use an optimization technique having as freedom degrees:

the grouping on the constraints which are processed simultaneously the ordering on these groups of constraints and having a cost function to optimize with the goal of minimizing the performance degradation due to conflicting situations. A particular realization of this method uses a cost function counting the number of conflicts.

This search can be computed off-line and the result stored into a ROM. The same constraint ordering is applied for each decoding iteration.

Another further optimization in the goal to eliminate conflicts can be obtained, in a serial PCP implementation, by adopting a different output sequence ordering and the corresponding input sequence ordering. This technique gives an additional freedom degree to the above mentioned optimization technique.

According to another variant, the sequence ordering of the output messages is reversed with respect to the ordering of the input messages.

For a more detailed justification of this method, it can be added that if the output sequence is the same as the input sequence, the conflict timing delay is the same for each edge of the code (if the code is supposed to be regular). This can result in an impossibility to remove some conflicts by applying the above mentioned methods. Adopting a different order for serial input and output to/from the PCP can ease the conflict elimination by a wider distribution of the conflict timing delays around its mean value: some edges will have a shorter conflict timing delay, some others a higher one.

Figure 15:
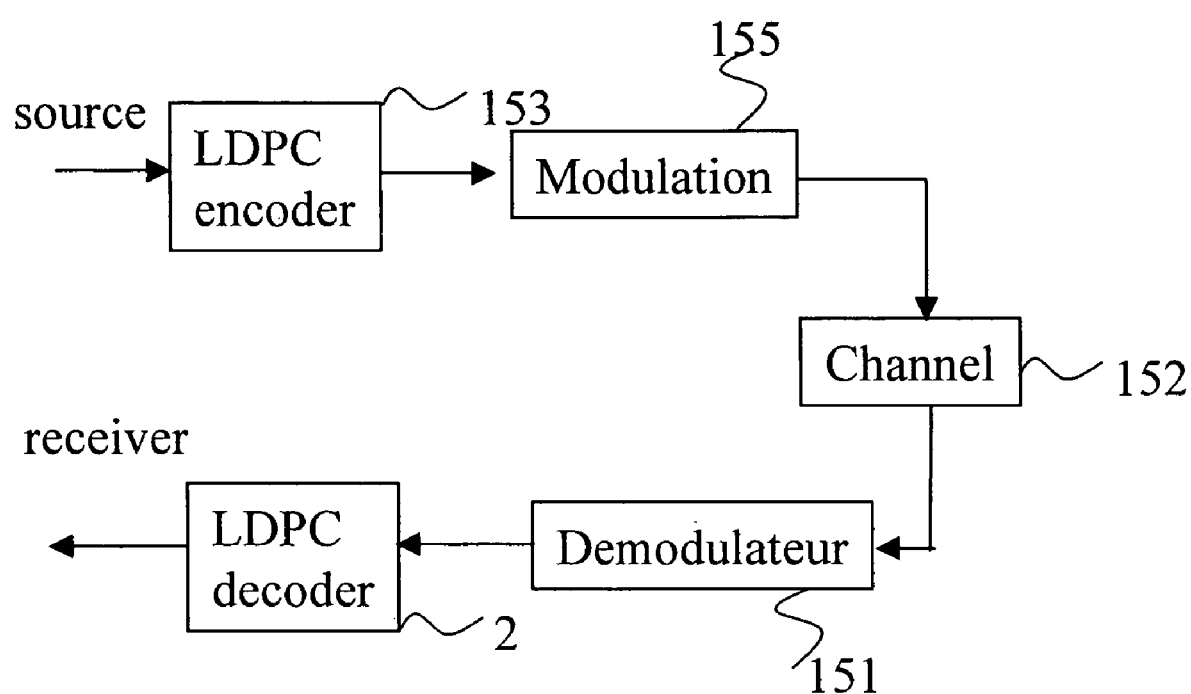
FIG. 15 presents a transmission system using the decoder of FIG. 2.

FIG. 15 presents a transmission system using an LDPC code.

It describes a system using an LDPC code. First the messages generated by the source is encoded by the LDPC encoder (153). The encoded message is transmitted to the receiver through a modulator (155), a channel (152) and a demodulator (151). Then, the LDPC decoder (2) perform the decoding of the noisy received codeword.

Naturally, the invention is not limited to the above-mentioned examples of use.

In particular, those skilled in the art will be able to provide any variant in the number of Parity Check Processors working in parallel.

Many compression methods can be used according to the invention.

The shuffle means can be implemented in many ways according to the invention (predefined permutation rotation, cross-bar, pseudo-random permutation). The shuffle is implemented as packet network where messages are associated to an address switch dynamically the message in the network.

According to the invention, the first storage means can be implemented through FIFO, RAM, register banks or any kind of memory.

Computation means can be sequenced, synchronous, asynchronous according to the invention.

According to the invention, the control of the decoder can be used the same structure to decode code of different rates and enables to switch dynamically from one codeword to another.

The invention can be used in a system where decoding is performed on one codeword while receiving another codeword.

Codeword can be of any length (e.g., 1000 to 100000) according to the invention.

The invention is compatible with an ARQ protocol, for instance by beginning of decoding a codeword whereas all the codewords are not received.

It will furthermore be noted that the invention is not limited to a purely hardware layout but that it can also be implemented in the form of a sequence of instructions of a computer program or any form combining a hardware part and a software part. Should the invention be implanted partially or totally in software form, the corresponding sequence of instructions could be stored in a storage means that may or may not be detachable (for example, it could be stored in a floppy disk, a CD-ROM or a DVD ROM), this storage means being partially or totally readable by a computer or a microprocessor.

Although the present invention has been described with reference to preferred embodiments, workers skilled in the art will recognize that changes may be made in form and detail without departing from the spirit and scope of the invention.

What is claimed is:

1. A decoder of Low Density Parity Check codewords on $GF(r^q)$, the decoder using the iterative belief propagation algorithm and comprising at least storing means to store a posteriori information on variables;

updating means to update the a posteriori information on variables;

first computation means to compute variable to constraint messages from a posteriori information on variables and variable to constraint messages from previous iteration;

second computation means to compute constraint to variable messages from variable to constraint messages computed by the first computation means; and third and fourth computation means to update the a posteriori information on variables;

wherein the decoder comprises:

first shuffle means to transfer the a posteriori information on variables to the first computation means;

second shuffle means to transfer information from the third computation means to the fourth computation means; and compression-storage-decompression means of constraint to variable messages.

2. A decoder according to claim 1, wherein at least one second computation means takes into account a predetermined number of the variable to constraint messages which have the lowest magnitude level.

3. A decoder according to claim 2, wherein at least one second computation means outputs at least three different magnitudes of constraint to variable messages.

4. A decoder according to claim 2, wherein the first computation means, the second computation means and the compression-storage-decompression means are gathered in parity check processing means, at least one parity check processing means comprising:

first decompression means to decompress constraint to variable messages of the previous iteration;

first computation means to compute variable to constraint messages from a posteriori information on variables and variable to constraint messages from previous iteration;

storage means to store compressed information representing constraints to variable messages;

pre-processing means to select lambda variable to constraint messages of lowest magnitude and respective references;

constraint to variable computation means to compute the lambda plus one different magnitudes of the constraint to variable messages generated; and second decompression means to generate the constraint to variable messages of the current iteration.

5. A decoder according to claim 1, wherein the third computation means generates the difference between constraint to variable messages of the current iteration and the one of the previous decoding iteration.

6. A decoder according to claim 1, wherein the third computation means generates an updated version of a posteriori information on variables.

7. A decoder according to claim 1, wherein the a posteriori information on variables is partially updated with constraint to variable information more than once during one decoding iteration.

8. A decoder according to claim 1, wherein the a posteriori information on variables is partially updated with constraint to variable information as many times as there are parity constraints connected to the variable.

9. A decoder according to claim 1, wherein the information related to a constraint is transferred sequentially through the first and second shuffle means.

10. A decoder according to claim 9, wherein the sequential output order of the second computation means differs from its input order.

11. A system comprising a decoder of Low Density Parity Check codewords on $GF(r^q)$, the decoder using the iterative belief propagation algorithm and comprising at least storing means to store a posteriori information on variables on variables;

updating means to update the a posteriori information on variables;

first computation means to compute variable to constraint messages from a posteriori information on variables and variable to constraint messages from previous iteration;

second computation means to compute constraint to variable messages from variable to constraint messages computed by the first computation means; and third and fourth computation means to update the a posteriori information on variables;

wherein the decoder comprises furthermore first shuffle means to transfer the a posteriori information on variables to the first computation means; and second shuffle means to transfer information from the second computation means to the storing means; and compression-storage-decompression means of constraint to variable messages and wherein the system comprises furthermore means of reception of Low Density Parity Check codewords.

12. A system according to claim 11, comprising further means to handle digital data belonging to the group consisting of:

data transmitted over a wireless channel;

data broadcast over a wireless channel; and data stored on a medium.

13. A decoding method of Low Density Parity Check code words, the method using the iterative belief propagation algorithm and comprising at least following steps:

storing of a posteriori information on variables;

updating of the a posteriori information on variables;

first computation step computing variable to constraint messages from a posteriori information on variables and variable to constraint messages from previous iteration;

second computation step computing constraint to variable messages from variable to constraint messages from previous iteration; and third computation step computing the a posteriori information on variables;

wherein the decoding method comprises furthermore first shuffle step transferring the symbol a posteriori information to the first computation step;

second shuffle step transferring information from the second computation step to the storing step; and compression-storage-decompression step of constraint to variable messages.

14. A computer program product to decode Low Density Parity Check code words, using the iterative belief propagation algorithm, the computer program product comprising program code instructions recorded on a carrier that can be used in a computer comprising computer-readable programming means to perform the following steps:

storing of a posteriori information on variables;

updating of the a posteriori information on variables;

first computation step computing variable to constraint messages from a posteriori information on variables and variable to constraint messages from previous iteration;

second computation step computing constraint to variable messages from variable to constraint messages from previous iteration;

third computation step computing the a posteriori information on variables;

first shuffle step transferring the symbol a posteriori information to the first computation step;

second shuffle step transferring information from the second computation step to the storing step; and compression-storage-decompression step of constraint to variable messages.

* * * * *